(12) United States Patent
Furukawa et al.

(10) Patent No.: US 7,364,982 B2
(45) Date of Patent: Apr. 29, 2008

(54) PROCESS FOR PREPARING A BONDING TYPE SEMICONDUCTOR SUBSTRATE

(75) Inventors: Kazuyoshi Furukawa, Kawasaki (JP); Yasuhiko Akaike, Kawasaki (JP); Shunji Yoshitake, Kawasaki (JP)

(73) Assignee: Kabushiki Kaisha Toshiba, Kawasaki-Shi (JP)

(*) Notice: Subject to any disclaimer, the term of this patent is extended or adjusted under 35 U.S.C. 154(b) by 0 days.

(21) Appl. No.: 11/621,638

(22) Filed: Jan. 10, 2007

(65) Prior Publication Data
US 2007/0111473 A1 May 17, 2007

Related U.S. Application Data

(62) Division of application No. 10/961,066, filed on Oct. 12, 2004, now Pat. No. 7,217,635, which is a division of application No. 10/211,707, filed on Aug. 5, 2002, now Pat. No. 6,815,312, which is a division of application No. 09/589,452, filed on Jun. 8, 2000, now Pat. No. 6,465,809.

(30) Foreign Application Priority Data

| Jun. 9, 1999 | (JP) | .................. 11-162985 |
| Jun. 21, 1999 | (JP) | .................. 11-174138 |
| Mar. 28, 2000 | (JP) | .................. 2000-089754 |

(51) Int. Cl.
*H01L 21/30* (2006.01)
(52) U.S. Cl. .................. 438/455; 257/E21.09
(58) Field of Classification Search .......... 257/E21.09, 257/E21.092, E21.097, E21.102, E21.108, 257/E21.115, E21.117, E21.21, E21.461, 257/E21.562
See application file for complete search history.

(56) References Cited

U.S. PATENT DOCUMENTS

| 4,542,105 A | 9/1985 | Furukawa et al. |
| 4,738,935 A | 4/1988 | Shimbo et al. |
| 4,878,957 A | 11/1989 | Yamaguchi et al. |
| 4,948,748 A | 8/1990 | Kitahara et al. |
| 4,987,472 A | 1/1991 | Endo et al. |

(Continued)

FOREIGN PATENT DOCUMENTS

EP 0 190 508 8/1986

(Continued)

OTHER PUBLICATIONS

U.S. Appl. No. 11/538,646, filed Oct. 4, 2006, Kato et al.

(Continued)

*Primary Examiner*—Scott B. Geyer
(74) *Attorney, Agent, or Firm*—Oblon, Spivak, McClelland, Maier & Neustadt, P.C.

(57) ABSTRACT

The process comprises a step of growing epitaxially mixed crystals of a compound semiconductor represented by the composition formula $In_x(Ga_{1-y}Al_y)_{1-x}P$ on a GaAs substrate 12 to form an epi-wafer having an n-type cladding layer 14 ($0.45<x<0.50$, $0\leq y\leq 1$), an active layer 15, a p-type cladding layer 16 and a cover layer 17; a step of removing the cover layer 17 by etching to expose the surface of the p-type cladding layer 16; a step of integrally joining a mirror-finished GaP substrate 11 on the p-type cladding layer 16 by placing the GaP substrate on the cladding layer at room temperature so that the mirror-finished surface of the GaP substrate may come into contact with the p-type cladding layer 16; a step of subjecting the resultant laminate to a heat treatment; a step of carrying out an etching treatment from the side of the GaAs substrate 12 to expose the n-type cladding layer 14; and a step of forming electrodes 19 on the surface of the n-type cladding layer 14 and on the back surface of the GaP substrate 11, respectively.

13 Claims, 24 Drawing Sheets

U.S. PATENT DOCUMENTS

| | | |
|---|---|---|
| 5,049,968 A | 9/1991 | Nakagawa et al. |
| 5,072,287 A | 12/1991 | Nakagawa et al. |
| 5,097,314 A | 3/1992 | Nakagawa et al. |
| 5,332,920 A | 7/1994 | Nakagawa et al. |
| 5,376,580 A | 12/1994 | Kish et al. |
| 5,413,951 A | 5/1995 | Ohori et al. |
| 5,428,227 A | 6/1995 | Satoh |
| 5,461,243 A | 10/1995 | Ek et al. |
| 5,502,316 A | 3/1996 | Kish et al. |
| 5,508,522 A | 4/1996 | Nakanishi et al. |
| 5,512,774 A | 4/1996 | Nakagawa et al. |
| 5,603,779 A | 2/1997 | Linn et al. |
| 5,661,316 A | 8/1997 | Kish, Jr. et al. |
| 5,668,402 A | 9/1997 | Mochizuki et al. |
| 5,688,702 A | 11/1997 | Nakagawa et al. |
| 5,726,623 A | 3/1998 | Mori |
| 5,769,991 A | 6/1998 | Miyazawa et al. |
| 5,783,477 A | 7/1998 | Kish, Jr. et al. |
| 5,793,062 A | 8/1998 | Kish, Jr. et al. |
| 5,869,849 A | 2/1999 | Jou et al. |
| 5,893,746 A * | 4/1999 | Usami et al. ............... 438/455 |
| 5,922,126 A | 7/1999 | Furukawa et al. |
| 5,945,703 A | 8/1999 | Furukawa et al. |
| 6,057,592 A | 5/2000 | Watanabe et al. |
| 6,107,648 A | 8/2000 | Shakuda et al. |
| 6,258,699 B1 | 7/2001 | Chang et al. |
| 6,465,809 B1 | 10/2002 | Furukawa et al. |
| 6,528,823 B2 | 3/2003 | Akaike et al. |
| 7,148,521 B2 | 12/2006 | Yasuda et al. |
| 2006/0043386 A1 | 3/2006 | Furukawa et al. |
| 2006/0043399 A1 | 3/2006 | Miyagaki et al. |

FOREIGN PATENT DOCUMENTS

| | | |
|---|---|---|
| EP | 0 562 880 | 9/1993 |
| EP | 0 611 131 | 8/1994 |
| EP | 0 616 376 | 9/1994 |
| EP | 0 664 557 | 7/1995 |
| EP | 0 851 513 | 7/1998 |
| EP | 0 908 933 | 4/1999 |
| JP | 61-183915 | 8/1986 |
| JP | 62-27040 | 6/1987 |
| JP | 6-349692 | 12/1994 |
| JP | 8-148723 | 6/1996 |
| JP | 11-154774 | 6/1999 |

OTHER PUBLICATIONS

Patent Abstracts of Japan, F. Kiyoshi, Publication No.: 61182215, Publication Date: Aug. 14, 1986.

Patent Abstracts of Japan, K. Masaki, Publication No.: 04223380, Publication Date: Aug. 13, 1992.

Office Action as received in corresponding European Application No. 00 304 862.6.

* cited by examiner

| No. | COMPOSITION RATIOS IN THE FORMULA (1) x | y | COMPOSITION RATIO OF InP | AlP | GaP | LATTICE CONSTANT CALCULATED (nm) | RATIO TO GaAs | BAND GAP (eV) | REMARKS |
|---|---|---|---|---|---|---|---|---|---|
| 1 | 1.000 | 0.000 | 1 | 0 | 0 | 0.5868 | 1.0380 | 1.35 | InP BINARY ALLOY |
| 2 | 0.000 | 1.000 | 0 | 1 | 0 | 0.5463 | 0.9662 | 2.43 | AlP BINARY ALLOY |
| 3 | 0.000 | 0.000 | 0 | 0 | 1 | 0.5451 | 0.9641 | 2.26 | GaP BINARY ALLOY |
| 4 | 0.500 | 0.280 | 0.5 | 0.14 | 0.36 | 0.5661 | 1.0013 | 1.83 | EMBODIMENT (2) (A) ACTIVE LAYER |
| 5 | 0.500 | 1.000 | 0.5 | 0.5 | 0 | 0.5665 | 1.0021 | 1.89 | EMBODIMENT (2) (A) CLADDING LAYER |
| 6 | 0.500 | 0.043 | 0.5 | 0.0215 | 0.4785 | 0.5660 | 1.0011 | 1.81 | CONVENTIONAL (RED) ACTIVE LAYER |
| 7 | 0.500 | 0.700 | 0.5 | 0.35 | 0.15 | 0.5663 | 1.0018 | 1.87 | CONVENTIONAL (RED) CLADDING LAYER |
| 8 | 0.500 | 0.454 | 0.5 | 0.227 | 0.273 | 0.5662 | 1.0015 | 1.84 | CONVENTIONAL (GREEN) ACTIVE LAYER |
| 9 | 0.500 | 1.000 | 0.5 | 0.5 | 0 | 0.5665 | 1.0021 | 1.89 | CONVENTIONAL (GREEN) CLADDING LAYER |
| 10 | 0.490 | 1.000 | 0.49 | 0.51 | 0 | 0.5661 | 1.0014 | 1.90 | EMBODIMENT (2) (B) |
| 11 | 0.480 | 1.000 | 0.48 | 0.52 | 0 | 0.5657 | 1.0007 | 1.91 | EMBODIMENT (2) (B) |
| 12 | 0.470 | 1.000 | 0.47 | 0.53 | 0 | 0.5653 | 1.0000 | 1.92 | EMBODIMENT (2) (B) |
| 13 | 0.460 | 1.000 | 0.46 | 0.54 | 0 | 0.5649 | 0.9992 | 1.93 | EMBODIMENT (2) (B) |
| 14 | 0.450 | 1.000 | 0.45 | 0.55 | 0 | 0.5645 | 0.9985 | 1.94 | EMBODIMENT (2) (B) |
| 15 | 0.440 | 1.000 | 0.44 | 0.56 | 0 | 0.5641 | 0.9978 | 1.96 | EMBODIMENT (2) (B) |
| 16 | 0.430 | 1.000 | 0.43 | 0.57 | 0 | 0.5637 | 0.9971 | 1.97 | EMBODIMENT (2) (B) |
| 17 | 0.420 | 1.000 | 0.42 | 0.58 | 0 | 0.5633 | 0.9964 | 1.98 | EMBODIMENT (2) (B) |
| 18 | 0.410 | 1.000 | 0.41 | 0.59 | 0 | 0.5629 | 0.9957 | 1.99 | EMBODIMENT (2) (B) |
| 19 | 0.400 | 1.000 | 0.4 | 0.6 | 0 | 0.5625 | 0.9949 | 2.00 | EMBODIMENT (2) (B) |

FIG. 3

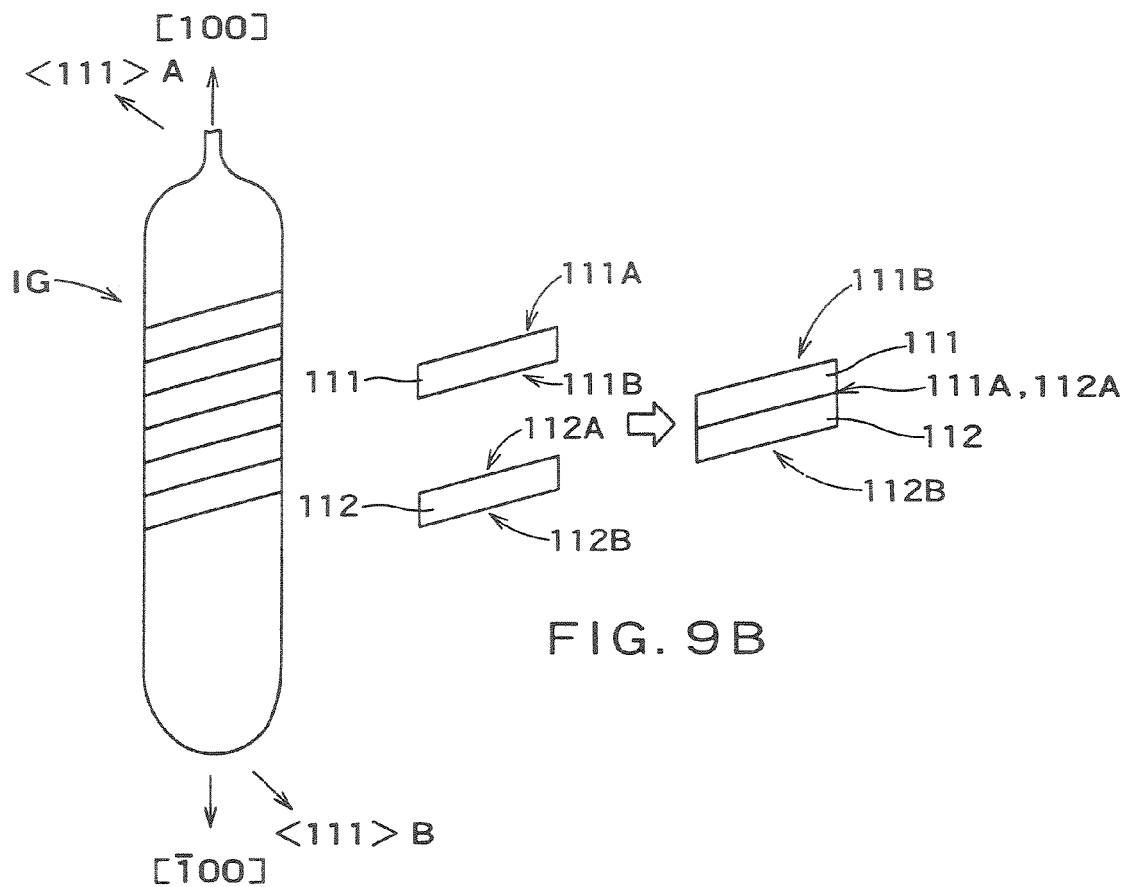
FIG. 9A
FIG. 9B
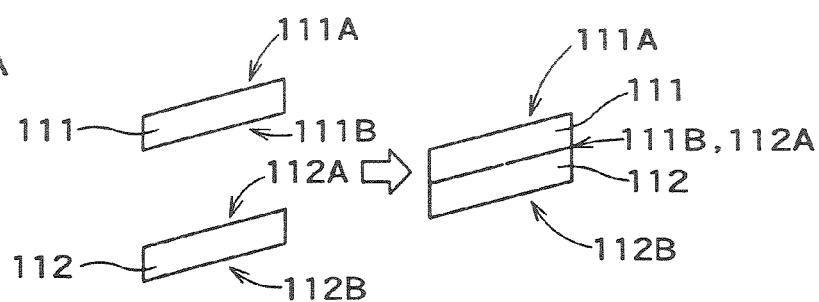
FIG. 9C

PROCESS FOR PREPARING A BONDING TYPE SEMICONDUCTOR SUBSTRATE

BACKGROUND OF THE INVENTION

The present invention relates to a bonding type semiconductor substrate and a semiconductor light emitting element, and preparation processes thereof. Particularly, the present invention relates to a bonding type semiconductor substrate based on a novel wafer direct bonding technique, a light emitting element such as LEDs (light emitting diode) with a high brightness obtained by applying the technique, and preparation processes thereof.

A light emitting element based on a conventional technique will be explained with reference to drawings attached hereto. FIG. 22 shows an embodiment of a visible light LED of InGaAlP based on a conventional technique.

In an LED 100 shown in FIG. 22, InGaAlP epitaxial growth layers 84, 85, 86 contributing to light emission are formed on an n-type GaAs substrate 82. Although not shown in this drawing, a buffer layer may be disposed between the substrate and the epitaxial growth layer in compliance with required specifications in order to obtain an excellent light emitting layer.

Electrodes 89 for supplying an electric current are each disposed on the upper surface of the epitaxial growth layer 86 and the lower surface of the substrate 82, respectively. Although not shown in the same drawing, a layer for diffusing the electric current or a layer for taking an electric contact is often disposed between an upper electrode 89 and the epitaxial growth layer 86. Among the epitaxial growth layers 84, 85, 86, the layer which can emit light by the recombination of carriers is the active layer 85. The epitaxial layers 84 and 85 formed on and under the active layer 85 are the cladding layers 84 and 86 having a wider band gap than the active layer in order to confine the carriers and to thereby heighten an emission efficiency.

For these epitaxial growth layers 84, 85 and 86, the band gap is required to be optimized according to a design for the purpose of adjusting the wavelength of the emission and for the purpose of confining the carriers. Furthermore, it is desirable for a good epitaxial growth that a lattice constant of the epitaxial growth layer matches a lattice constant of the substrate 82. Since InGaAlP which is a group III-V compound contains three elements of In, Ga and Al as components in the group III, the band gap and the lattice constant can be independently designed by selecting a composition ratio of these elements.

For example, when a composition of the epitaxial growth layer is represented by the following formula $$\text{In}_x(\text{Ga}_{1-y}\text{Al}_y)_{1-x}\text{P} \qquad (1),$$

the lattice constant of the epitaxial growth layer almost matches that of a GaAs substrate by setting a composition ratio (x) of In to 0.5. The band gap can be controlled by adjusting a composition ratio (y) between Al and Ga, while x=0.5 is kept up.

For example, in order to obtain a red light emitting LED having a wavelength of 644 nm, the composition ratio of the active layer 85 is set to x=0.5 and y=0.043, and the composition ratio of the cladding layers 84, 86 is set to x=0.5 and y=0.7. Moreover, in order to obtain a green light emitting LED having a wavelength of 562 nm, the composition ratio of the active layer 85 is set to x=0.5 and y=0.454, and the composition ratio of the cladding layers 84, 86 is set to x=0.5 and y=1.00, i.e., InAlP.

As illustrated in the above, for InGaAlP epitaxial growth layers, the wavelength of the emission can be selected within a region of visible light. Furthermore, since the layers can epitaxially grow under the lattice matching condition with a GaAs substrate which is most general as a compound semiconductor substrate, there exist advantages that the substrate is easily available and the epitaxial growth is relatively easy.

On the contrary, a GaAs substrate has a disadvantage that it absorbs light in a region of visible lights. Therefore, part of the light emitted on an InGaAlP epitaxial growth layer is absorbed by GaAs substrate, and hence a brightness of LED decreases unavoidably. For avoiding the decrease of the brightness, a material which is transparent in the region of the visible light is preferably employed as a substrate. The usual transparent material is GaP, but since the GaP substrate cannot obtain the lattice matching with InGaAlP, the good epitaxial growth is difficult. In order to solve this problem, U.S. Pat. No. 5,376,580 filed in 1993 proposes a method for a wafer bonding between an InGaAlP epitaxial growth layer and a GaP substrate. This proposed method comprises removing a GaAs substrate from the epitaxial growth layer, closely bonding a GaP substrate instead of the GaAs substrate, and then carrying out a heat treatment under pressure to integrally bond them. According to this method, the increase of the brightness of LED can be attained. However, the stability and productivity of the wafer bonding step are insufficient, because the epitaxial growth layer after the removal of the GaAs substrate is thin and thus its handling is difficult, and a special apparatus is necessary for the heat treatment under pressure.

Next, the following explains the wafer bonding. If two different kinds of wafers can be integrally bonded, a laminated structure comprising different materials could be obtained regardless of the lattice constant, and a different substance can be buried inside as represented by SOI (silicon on insulator). For these reasons, various wafer bonding techniques have been proposed hitherto. For example, the above-mentioned bonding method of subjecting two wafers to the heat treatment while they are pressed is disclosed in Japanese Patent No. 765892 filed in 1970. The wafer bonding technique has been desired for a long time, but it is difficult to accomplish the integral bonding all over the surface of the wafer, so that this technique has not been practiced.

The present inventors have developed a technique called "direct bonding" or "direct joining" as a practicable technique. For example, Japanese Patent No. 1420109 filed in 1983 and the like describes the direct bonding between Si wafers, and Japanese Patent No. 2040637 filed in 1985 and the like describes the direct bonding between compound semiconductor wafers.

The direct bonding technique comprises mutually closely bonding two substrates having mirror-finished surfaces by themselves at room temperature under a substantially dust-free atmosphere, and then integrally joining them by a heat treatment. This technique has an advantage that the whole surface can be joined without leaving any unbonded part, because the whole surfaces are closely bonded to each other prior to the heat treatment. Moreover, it is not necessary to apply a pressure during the heat treatment, any special apparatus or equipment is not required. The mechanism of the direct bonding between the Si wafers is understood as follows.

Namely, at the beginning, OH groups are formed on the surface of the wafer by cleaning or washing with water. Then, when the surfaces of the two wafers are contacted with each other, the OH groups attract each other by a hydrogen bond, so that the wafers closely bond at room temperature. A bonding power in this case is strong enough to eliminate a usual warp of the wafer, whereby the close bonding all over the surfaces can be achieved. During the heat treatment, a dehydrative condensation (Si—OH:HO—Si→Si—O—Si+$H_2O$) occurs at a temperature higher than 100° C., and the wafers bond to each other via oxygen atoms, thereby increasing a bonding strength. When the temperature further rises, the diffusion and rearrangement of the atoms in the vicinity of a bonding interface occur, so that the wafers are integrated mechanically and electrically. The bonding mechanism of the compound semiconductors is considered to be similar.

Next, one example of a preparation process of an LED comprising an InGaAlP-based epitaxial growth layer closely bonded to the GaP substrate by utilizing the direct bonding will be explained with reference to FIG. 23.

First, as shown in FIG. 23A, an n-type cladding layer 94, an active layer 95 and a p-type cladding layer 96 are grown on an n-type GaAs substrate 92. Then, as shown in FIG. 23B, a GaP substrate 91 is directly bonded to the surface of the epitaxial growth layer 96. Furthermore, shown in FIG. 23C, the GaAs substrate 92 is removed by polishing or etching, and after upside down, electrodes 99 are disposed on the upper surface of the n-type cladding layer 94 and under the lower surface of GaP substrate 91, respectively, so that an InGaAlP-based LED having GaP as the substrate 91 is obtained as shown in FIG. 23D.

In the case that the different materials are directly bonded to each other in such a manner, especially in the case that the surfaces of the epitaxial growth layers are directly bonded, the following problems exist, in contrast to the direct bonding of the same wafers such as Si wafers or GaAs wafers.

First, on the surface of the epitaxial growth layer, particles such as dust are more easily deposited than on the surface of the wafer. Accordingly, the bonding at room temperature is hindered, and even after the heat treatment, the boding is not accomplished all over the surface and hence there is a problem that unbonded portion called "voids" occur. Generally, the surface of a wafer is kept clean and a clean substrate is employed as a substrate for epitaxial growth. However, particle adhesion on the surface of the epitaxial growth layer is inevitable to some extent at present, since reaction products are deposited during the epitaxial growth and dust particles adhere in a pre-treatment step or a post-treatment step of the epitaxial growth step.

Second, since the wafer is warped by the epitaxial growth, there is a problem that it is impossible to bond the whole surface of the wafers closely at room temperature.

Third, since difference of thermal expansion exists between different materials, there is a problem that thermal stress occurs during the heat treatment, and thereby the bonded substrate is broken by the stress.

Fourth, since difference of thermal expansion exists between different materials, a gap at the bonding interface occurs during the heat treatment for bonding even if the breakage of the bonded substrate does not occur, and thus the whole surface of the substrate cannot be bonded homogeneously by "the gap".

Fifth, there is a problem that electric resistance is generated at the bonding interface. The original investigation of the present inventors discloses that an electrically resistive component is generated by bonding the wafers. When LED, for example, is formed using such a bonded substrate, the electric resistance at the bonding interface increases operating voltage of LED and thus problems such as a poor emission and a heat generation occur.

SUMMARY OF THE INVENTION

The present invention has been accomplished in view of the above circumstances, and an object of the present invention is to provide a bonding type semiconductor substrate directly, stably and closely bonded all over the surface of an epitaxial growth layer formed on a semiconductor substrate.

Another object of the present invention is to provide a semiconductor light emitting element.

Still another object of the present invention is to provide a preparation process of the above substrate.

A further object of the present invention is to provide a preparation process of the above light emitting element.

In the present invention, the above-mentioned objects can be achieved by the following constitutions.

According to the present invention, there is provided a bonding type semiconductor substrate comprising a first epitaxial growth layer formed on a first semiconductor substrate, and a second semiconductor substrate whose at least one surface is mirror-finished and which is integrally bonded to the first epitaxial growth layer via the mirror-finished surface or a second epitaxial growth layer grown on the mirror-finished surface; a thermal expansion coefficient of the first epitaxial growth layer being close to a thermal expansion coefficient of the second semiconductor substrate.

Since the thermal expansion coefficient of the first epitaxial growth layer is close to the thermal expansion coefficient of the second semiconductor substrate, the bonded semiconductor substrate is not broken by the generation of thermal stress, even when a heat treatment is carried out prior to the removal of the first semiconductor substrate. Accordingly, the bonding type semiconductor substrate stably and closely bonded can be provided.

According to the present invention, there is also provided a semiconductor light emitting element comprising:

a first epitaxial growth layer formed from mixed crystals of a compound semiconductor on a first semiconductor substrate, said first epitaxial growth layer including a first cladding layer formed by selecting a composition ratio of the mixed crystals so as to match a lattice constant of said first semiconductor substrate, an active layer formed on said first cladding layer, and a second cladding layer formed on said active layer; said first semiconductor substrate being removed from the first epitaxial growth layer;

a second semiconductor substrate whose a main surface is mirror-finished and which is directly bonded to said first epitaxial growth layer via the mirror-finished surface or a second epitaxial growth layer grown on the mirror-finished surface.

Since the lattice constant of the first epitaxial growth layer matches that of the first semiconductor substrate, the warp of a wafer having the epitaxial growth layer (hereinafter, referred to as "epi-wafer") can be reduced. Accordingly, there can be provided the bonding type semiconductor substrate where even the relatively thick epi-wafer is stably and closely joined to the second semiconductor substrate.

The first semiconductor substrate is formed from GaAs, the second semiconductor substrate is formed from GaP, and the epitaxial growth layer is represented by the formula $In_x(Ga_{1-y}Al_y)_{1-x}P$. A composition ratio in the above composition formula of the first cladding layer is suitably $0.45 < x < 0.50$ and $0 \leq y \leq 1$.

According to the invention, there provided a process for preparing a bonding type semiconductor substrate comprising:

a first step of forming a first epitaxial growth layer by epitaxially growing semiconductor crystals on a first semiconductor substrate, a second step of removing contaminants and dust particles from the surface of said first epitaxial growth layer, and a third step of integrally joining, to said first epitaxial growth layer from which the contaminants and the dust particles are removed in the second step, a second semiconductor substrate whose at least one surface is mirror-finished, by placing the substrate on the first epitaxial growth layer so that the substrate may come into contact with the first epitaxial growth layer via the mirror-finished surface or a second epitaxial growth layer grown on the mirror-finished surface.

Since particles deposited onto the surface of the epitaxial growth layer can be removed in the second step, the second semiconductor substrate can be joined to the epitaxial growth layer. Accordingly, the semiconductor substrate can be prepared in a high yield.

According to the invention, there also provided a process for preparing a bonding type semiconductor substrate comprising:

a first step of forming an epitaxial growth layer by epitaxially growing semiconductor crystals on a first semiconductor substrate by selecting a composition ratio so as to match a lattice constant of the first semiconductor substrate, a second step of removing contaminants and dust particles from the surface of said epitaxial growth layer, and a third step of integrally joining a second semiconductor substrate, whose at least one surface is mirror-finished, to said epitaxial growth layer by placing the substrate on the epitaxial growth layer so that the substrate may come into contact with the epitaxial growth layer via the mirror-finished surface.

Since the lattice constant of the epitaxial growth layer matches that of the first semiconductor substrate, the warp of the epi-wafer can be reduced. Accordingly, the epi-wafer can be stably joined to the second semiconductor substrate, so that the bonding type semiconductor substrate can be prepared in a higher yield.

The process may further comprising a forth step of subjecting the resultant laminate to a heat treatment after at least part of the surface of said first semiconductor substrate has been removed therefrom.

In the above fourth step, at least the surface part of the first semiconductor substrate is removed prior to the heat treatment, and hence an average thermal expansion coefficient of the whole epi-wafer is much the same as the thermal expansion coefficient of the epitaxial growth layer and is close to the thermal expansion coefficient of the second semiconductor substrate. Accordingly, the breakage of the bonded substrate at the successively repeated heat treatment can be prevented, so that the joining type semiconductor substrate which is more excellent in bonding strength can be prepared in a much higher yield.

Moreover, the above first step preferably contains a step of forming a cover layer on the epitaxial growth layer, and the above second step is desirably a step of removing the cover layer by etching. Accordingly, it is unnecessary to directly remove the surface part of the epitaxial growth layer, whereby it becomes possible to precisely control the thickness of the epitaxial growth layer.

According to the invention, there also provided a process for preparing a semiconductor light emitting element comprising:

a step of forming a first epitaxial growth layer comprising a laminate where a first cladding layer, an active layer, and a second cladding layer are deposited in turn on a first semiconductor substrate by growing mixed crystals of a compound semiconductor, a step of forming a cover layer on said first epitaxial growth layer, a step of exposing a surface of said first epitaxial growth layer by removing said cover layer, a step of integrally joining a second semiconductor substrate having a mirror-finished main surface to said first epitaxial growth layer having the exposed surface by placing the substrate on said first epitaxial growth layer so that said main surface of the substrate may come into contact with said first epitaxial growth layer, a step of subjecting the laminate to a heat treatment at a temperature below a temperature at which the bonding surface is broken owing to a difference between thermal expansion coefficients of said first semiconductor substrate and said second semiconductor substrate, a step of exposing said first epitaxial growth layer by removing said first semiconductor substrate, and a step of forming electrodes on the front side of said first epitaxial growth layer and on the back side of said second semiconductor substrate.

The above first cladding layer is desirably formed by selecting a composition ratio of the mixed crystals so that the lattice constant may match the lattice constant of the first semiconductor substrate.

According to the invention, there also provided a process for preparing a semiconductor light emitting element comprising:

a step of forming an epitaxial growth layer comprising a laminate where a first cladding layer, an active layer, and a second cladding layer are deposited in turn on a first semiconductor substrate by epitaxially growing mixed crystals of a compound semiconductor, a step of forming a cover layer on said second cladding layer, a step of exposing the surface of said second cladding layer by removing said cover layer, a step of integrally bonding a second semiconductor substrate having a mirror-finished main surface to said second cladding layer having the exposed surface by placing the substrate on said second cladding layer so that said main surface of the substrate may come into contact with said second cladding layer, a step of carrying out a heat treatment after at least a surface part of said first semiconductor substrate has been removed by etching, a step of exposing said first cladding layer by etching, and a step of forming electrodes on the front side of said first cladding layer and on the back side of said second semiconductor substrate.

The epitaxial growth layer is formed between the first semiconductor substrate and the laminate, and preferably contains a protective film which functions as an etching stopper in the step of removing the first semiconductor substrate. This protective film can afford a margin at the time of the etching and can also prevent the evaporation of doped impurities and P (phosphorus) which is a constitutional component of the first cladding layer in the step of the above heat treatment.

According to the another aspect of the invention, crystals are aligned in a substantially similar direction, and hence a dangling bond and crystal defects can be reduced and the rise of electric resistance can be inhibited.

More specifically, there provided a bonding type semiconductor substrate comprising:

a first epitaxial growth layer formed on a first semiconductor substrate; and a second semiconductor substrate whose at least one surface is mirror-finished and which is integrally joined to said first epitaxial growth layer via the mirror-finished surface or a second epitaxial growth layer grown on the mirror-finished surface, both of said first semiconductor substrate and said second semiconductor substrate being made from compounds, a surface where a (111) A plane preferentially appears in the main surface of the second semiconductor substrate being bonded to a surface where a (111) B plane preferentially appears in the main surface of said first semiconductor substrate, or a surface where a (111) B plane preferentially appears in the main surface of the second semiconductor substrate being bonded to a surface where a (111) A plane preferentially appears in the main surface of said first semiconductor substrate There also provided a semiconductor light emitting element comprising a remaining part of a bonding type semiconductor substrate, said bonding type semiconductor substrate having:

a first epitaxial growth layer formed on a first semiconductor substrate; and a second semiconductor substrate whose at least one surface is mirror-finished and which is integrally joined to said first epitaxial growth layer via the mirror-finished surface or a second epitaxial growth layer grown on the mirror-finished surface, both of said first semiconductor substrate and said second semiconductor substrate being made from compounds, a surface where a (111) A plane preferentially appears in the main surface of the second semiconductor substrate being bonded to a surface where a (111) B plane preferentially appears in the main surface of said first semiconductor substrate, or a surface where a (111) B plane preferentially appears in the main surface of the second semiconductor substrate being bonded to a surface where a (111) A plane preferentially appears in the main surface of said first semiconductor substrate said remaining part being obtained by removing at least part of said first semiconductor substrate from said bonding type semiconductor substrate.

According to another aspect on the invention, there provided a semiconductor light emitting element comprising a light emitting layer and a substrate having a transparency to emission, wherein an area of said light emitting layer on said substrate is smaller than an area of said substrate.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the Drawings:

FIG. 3 is a table showing component ratios, lattice constants and band gaps of InGaAlP materials used in the preparation process of the bonding type semiconductor substrate according to the present invention;

FIGS. 9A-9C are schematic diagrams explaining a bonding method of a substrate in the fourth embodiment according to the present invention;

DETAILED DESCRIPTION OF THE PREFERRED EMBODIMENTS

The following explains some embodiments according to the present invention with reference to the attached drawings.

First Embodiment

The first embodiment according to the present invention will be explained. The embodiment is the one wherein a bonding type semiconductor substrate according to the present invention is applied to an InGaAlP-based LED.

Figure 1:
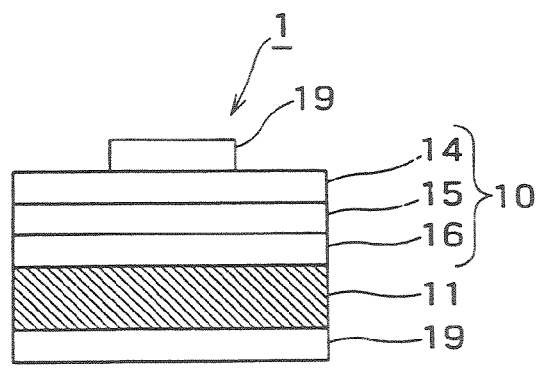
FIG. 1 is a schematic cross-sectional view showing one embodiment of a bonding type semiconductor substrate according to the present invention.

FIG. 1 is a schematic cross-sectional view showing the InGaAlP-based LED in this embodiment. An LED 1 shown in the same drawing comprises a laminate 10 including the epitaxial layers 14-16. The laminate 10 may include various structure other than the specific example shown in the figure.

In the example shown in FIG. 1 the laminate includes an active layer 15, an n-type cladding layer 14 and a p-type cladding layer 16 between which the active layer 15 is interposed; a GaP substrate 11 integrally joined to the lower surface of the laminate; and electrodes 19 formed on the upper surface of the n-type cladding layer and on the lower surface of GaP substrate, respectively. However, the invention is not limited to this specific example. The laminate may include other layers such as a contact layer and/or a bonding layer as shown in FIG. 16 afterwards.

The laminate 10 is formed by epitaxially growing mixed crystals of a compound semiconductor using GaAs substrate as a substrate for growth which is not shown in the drawing. The GaP substrate 11 is directly bonded closely and joined at room temperature, the main surface defined as the surface to be joined to the cladding layer 16 being mirror-finished, and the laminate 10 being left as it is formed on the substrate for growth. The substrate for growth is removed after the close bonding and joining.

All of the active layer 15 and two cladding layers 14 and 16 can be represented by the above-mentioned formula 1). As mentioned below, since each composition is suitably selected so as to obtain a lattice matching the substrate for growth, especially at room temperature, warp of the substrate for growth is remarkably reduced and, as a result, it is enabled to join the GaP substrate 11 to the laminate 10 over the whole surfaces.

In the embodiment, the GaP substrate 11 for p-type one has diameter of 2 inches and thickness of 250 μm, and the p-type cladding layer 16 has thickness of 0.6 μm, and its composition ratio is x=0.5 and y=1.0 when represented by the above-mentioned formula 1). Moreover, the active layer 15 has thickness of 0.6 μm, and its composition ratio is x=0.5 and y=0.28. Furthermore, the n-type cladding layer 14 has thickness of 0.6 μm, and its composition ratio is x=0.5 and y=1.0.

Thus, since LED 1 of the present embodiment is formed on the GaP substrate which does not absorb the light in the region of visible light, it can emit light of high brightness.

When emitting property of the LED 1 is evaluated, it is confirmed that its brightness is more than twice as high as that of LED 100.

Second Embodiment

As second embodiment of the present invention, the embodiment of process for preparing a bonding type semiconductor substrate is explained with reference to the drawings. In the following, the process is applied to preparations of InGaAlP LEDs as concrete examples, more specifically some examples of process for preparing LED 1 shown in FIG. 1 are illustrated.

FIRST EXAMPLE

The first example of process for preparing a bonding type semiconductor substrate according to the present invention is explained with reference to FIG. 2. The present example solves the problem of particle attachment to the surface of the epitaxial growth layer formed on the first semiconductor substrate, and the characteristic points are to form a cover layer on the surface of the epi-wafer, and to remove particles attached to the epi-wafer together with the cover layer prior to direct bonding of the second semiconductor substrate to the epi-wafer.

FIGS. 2A to 2D are rough cross sections illustrating a process according to the present example. In FIG. 2, the top and bottom in FIG. 1 is reversed.

Figure 2A:
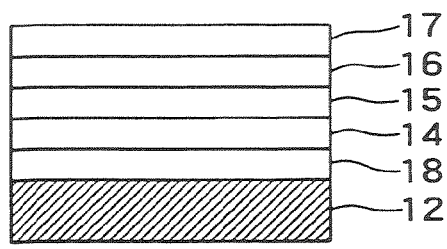
FIGS. 2A-2D are schematic cross-sectional views explaining the first and second examples of a preparation process of the bonding type semiconductor substrate according to the present invention.

As shown in FIG. 2A, the epi-wafer for direct bonding is formed by laminating a buffer layer 18 on an n-type GaAs substrate 12, an n-type cladding layer 14, an active layer 15, a p-type cladding layer 16 and a surface cover layer 17, successively. These epitaxial growth layers are formed according to, for example, MOCVD (Metal Organic Chemical Vapor Deposition) method.

The n-type GaAs substrate 12 has a size of diameter of 2 inches and thickness of 250 μm, is doped with Si as impurity in a carrier concentration of about $1E18/cm^3$, and its main surface is mirror-finished. The buffer layer 18 is composed of GaAs, the thickness being 0.5 μm. Uppermost layer of the surface cover layer 17 is made of GaAs and the thickness is 0.1 μm.

Figure 2B:
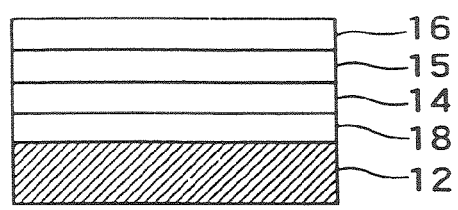

After the epi-wafer had been washed with a surfactant, etching was conducted by dipping the epi-wafer into a mixture of 8 parts by volume of sulfuric acid, 1 part by volume of aqueous hydrogen peroxide and 1 part by volume of water to remove the surface cover layer 17 as shown in FIG. 2B. The mixture selectively etches the GaAs cover layer. Although it was observed that the surface cover layer 17 was removed within several seconds, the surface of the p-type cladding layer 16 was completely exposed by continuing the dipping for 1 minute.

Figure 2C:
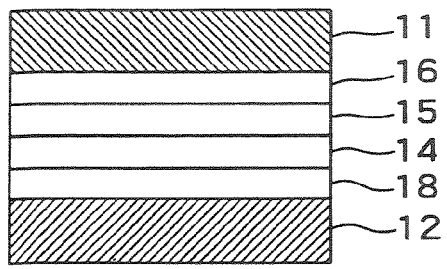

Then, the epi-wafer from which the surface cover layer 17 was removed was directly bonded to a GaP substrate 11 to obtain a bonded substrate shown in FIG. 2C. The following explains the step of direct bonding more precisely.

As a pre-treatment of direct bonding, a GaP substrate 11 was washed with a surfactant, dipped in dilute hydrofluoric acid to remove native oxide on the surface, and dried with a spinner after washing with water. In addition, the epi-wafer was, after the surface cover layer 17 had been removed according to the above-mentioned method, subjected to a treatment with dilute hydrofluoric acid in a similar manner as the above GaP substrate 11 case to remove oxide, followed by washing with water and drying with a spinner. All these pre-treatments were conducted under a clean atmosphere in a clean room.

Then, the epi-wafer subjected to the pre-treatment was placed so that the epitaxial layer may become the upper surface, the GaP substrate 11 was placed on the epi-wafer so that the mirror-finished surface may become the lower surface, and they were closely bonded at room temperature. Since the GaP is transparent, the bonding conditions can be observed by eye. When the GaP substrate 11 was placed on the epi-wafer, the central part of the GaP substrate 11 closely bonded first since the epi-wafer warped convexly in a front view. The closely bonded part spontaneously expanded to the peripheral part of the GaP substrate 11 only upon standing, and then, whole part of the GaP substrate closely bonded within 1 minute except for the peripheral chamfered part. A similar operation was repeated ten times at room temperature to obtain closely bonded ten pieces, the whole surface being closely bonded in all cases. For the comparison with the present example, an epi-wafer without the cover layer 17 was prepared and processed similarly except for etching of the cover layer. Attempted close bonding at room temperature resulted in generation of voids at 6 pieces and failure of close bonding at room temperature at 1 piece among the 10 pieces.

As a final step of the direct bonding, the substrates closely bonded at room temperature were stood up in line in a quartz boat and subjected to a heat treatment in a diffusion furnace. The bonded substrates were divided into two groups consisting of 5 pieces each, and one group was treated at 800° C. and the other at 400° C. The treating time was 1 hour in both cases and the atmosphere was argon containing 10% hydrogen. After the treatment, 3 pieces of the 5 pieces treated at 800° C. were broken or cracked on the epi-wafer side. On the other hand, 5 pieces treated at 400° C. remained without breakage or crack. Such a difference in accordance to the temperature at the heat treatment is due to the breakage of the bonded substrate which is resulted in by the thermal stress generated at the heat treatment of the room-temperature-bonded substrate at a high temperature because of the difference of thermal expansion coefficient between the epi-wafer of which substrate is GaAs and the GaP substrate. Since the difference of thermal expansion at temperature elevation and the difference of thermal contraction at temperature decrease are lowered in proportion to the temperature in the case of a low treating temperature, the breakage did not occur during the heat treatment at 400° C.

Figure 2D:
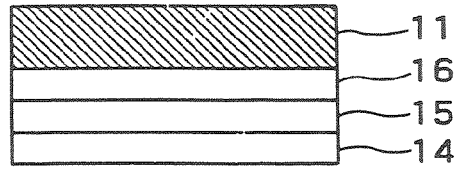

Then, the GaAs substrate 12 of the epi-wafer was removed as shown in FIG. 2D. The step of removing the GaAs substrate 12 was accomplished by dipping the bonded substrate into a mixture of ammonia and aqueous hydrogen peroxide, followed by selective etching of GaAs. The etching also removed the GaAs buffer layer 18 at the same time.

Finally, LED 1 shown in FIG. 1 was obtained by placing the electrodes 19 at the GaP substrate 11 and the n-type cladding layer 14.

The first example of the semiconductor light emitting element according to the present invention was explained in the above mainly regarding the steps of removing the GaAs cover layer on InGaAlP epitaxial growth layer by selective etching until the bonding. However, the entire cover layer is not necessarily removed and removal of only a part of the layer from its surface may be allowed as long as the similar effect is obtained. Furthermore, a surface part of the epitaxial layer to be bonded may be removed without placing the cover layer.

Since the cladding layer to be directly bonded is a layer donating light emission in the present example, the cover layer was placed and completely removed by selective etching in order to control the thickness precisely.

The process for removing the surface particles of the present example is effective not only at the direct bonding between the above-mentioned InGaAlP epitaxial growth layer and GaP substrate but also at wafer bonding to an epitaxial growth layer. In addition, the method of the bonding is not limited to the above-mentioned method, and the process for removing the surface particles of the present example is also applicable to a method of subjecting to a heat treatment under loading a weight, a bonding method with applying a voltage, and a bonding method using a bonding layer or a material for bonding.

SECOND EXAMPLE

The following explains second example of preparing a closely bonded semiconductor substrate according to the present invention. The present example solves the problem of insufficient bonding at room temperature in the step of the direct bonding by adjusting a lattice constant of InGaAlP material. The rest procedure is much the same as in the first example. The present example is also illustrated as a concrete example applied to a preparation of LED 1 with reference to rough cross section of FIG. 2.

In the above-mentioned first example, close bonding was possible over the whole surface using the epi-wafer having InGaAlP epitaxial growth layer total thickness of which was 1.8 μm and the GaP substrate having thickness of 250 μm. Although the epi-wafer had a warp of 11 μm to 18 μm, the wafer and the substrate bonded closely over the whole surface, as a result that bonding power at room temperature reformed the warp of the epi-wafer and the GaP substrate was warped concavely in accordance to the warp of the epi-wafer.

On the contrary, a similar direct bonding was attempted using an epi-wafer having InGaAlP epitaxial growth layer where total thickness was 3.6 μm and a GaP substrate having thickness of 350 μm. The epi-wafer had the same substrate and each epitaxial growth layer as in the first example. The thicknesses of the active layer 15, the buffer layer 18 and the cover layer 17 were the same as in the first example but each of the n-type cladding layer 14 and the p-type cladding layer 16 was made thicker, i.e., 1.5 μm. As the result, the warp of the epi-wafer was increased to 24 to 36 μm roughly in proportion to the total thickness of the InGaAlP epitaxial growth layer.

In this case, the central part of the epi-wafer closely bonded but close bonding over the whole surface was impossible. When the epi-wafer was absorbed to a flat vacuum chuck, close bonding over the whole surface was possible. From this result, it is understood that the reasons for the insufficient bonding are as follows: the warp of the epi-wafer is too large and adhesive power at room temperature cannot reform the warp of the wafer since the GaP substrate is too thick to change the shape.

The characteristic of the present example is to reduce the warp of the epi-wafer by adjusting the lattice constant without changing the properties affecting the emission such as a band gap, with utilizing the properties of an InGaAlP material. The InGaAlP material is mixed crystals of InP, GaP and AlP. According to the principle generally called the Vegard's law, the lattice constant and the band gap of mixed crystals becomes an averaged value in accordance to the composition ratio of the lattice constants and the band gaps of the substances composing the mixed crystals. For some InGaAlP materials, FIG. 3 shows composition ratios x and y in the formula 1), composition ratios of InP, GaP and AlP calculated from these x and y, and the lattice constant and the band gap calculated from the composition ratios according to the Vegard's law. For the lattice constant, the ratio to the lattice constant of GaAs that is 0.56533 nm is also shown. In the drawing, as understood from the composition ratios, Nos. 1, 2, and 3 are the cases of InP, AlP, and GaP, respectively, and the values of the column are employed for the calculation of the lattice constant and the band gap.

The columns of Nos. 4 and 5 show the composition of the epi-wafer with which close bonding at room temperature was impossible as explained in the first example of the process for preparing a bonding type semiconductor substrate according to the present invention. Moreover, the columns of Nos. 6 to 9 show the compositions of conventional red LED and green LED explained in the part of Background Art. As for the conventional red LED and green LED, all the lattice constants are larger than that of GaAs, and this fact is the reason for occurrence of warp of the epi-wafer.

Hitherto, a lattice constant of an epitaxial growth layer was matched with that of the substrate at a high temperature at which epitaxial growth was conducted. This aims to reduce lattice strain and thus to obtain a high quality epitaxial growth layer. However, even if the lattice constant is matched at a high temperature, since thermal expansion coefficient of an epitaxial growth layer is generally different from that of the substrate, the lattice constants becomes mismatched upon cooling to room temperature at the bonding step which resulted in occurrence of the warp.

The present invention is characterized by reduced warp of the epi-wafer with considering the lattice matching as important for realizing direct bonding. The concrete means are as follows.

In FIG. 3, the columns of Nos. 10 to 19 show changes of the lattice constant as. In composition of the cladding layer is reduced from the original value of the epi-wafer (No. 5) with which close bonding at room temperature is failed. When x is 0.47, the lattice constant becomes the same as that of GaAs. When x is below 0.47, the lattice constant becomes smaller than that of GaAs, and as a result, a stress acts on the wafer to warp the wafer concavely. Thus, an epi-wafer was prepared by way of trial by changing only the composition of the cladding layer and subjected to direct bonding test. As the value of x was lowered, the warp of the epi-wafer decreased. At x=0.47, the warp decreased to 6 to 12 μm and it was possible to closely bond over the whole surface at room temperature. There existed some GaP substrates with which close bonding at room temperature was possible at X=0.48 or X=0.49. At x=0.45, mismatching of the growing lattice becomes remarkable and crystal defect increased. The allowable range of the value of x cannot be defined without reservation since it depends on the thickness of epitaxial growth layer and the thickness of GaP substrate. When x is smaller than conventional 0.5, an effect of reducing the warp is attained and inconvenience in epitaxial growth occurs at lower than 0.45. By the way, although the reduction of In composition increases the band gap, the effect on emission wavelength is little since the cladding layer has a function to confine carriers and does not emit directly. In the present example, the composition of the active layer was not changed in order to avoid the change of emission wavelength. Furthermore, since the warp of the wafer hinders wafer bonding at any method of bonding, the present example is not limited to the direct bonding between InGaAlP epitaxial growth layer and GaP wafer but also provides similar effects even when applied to the other wafer bonding.

THIRD EXAMPLE

The following explains third example of preparing a closely bonded semiconductor substrate according to the present invention. The present example solves the problem of breakage resulted in from the difference of thermal expansion between wafers to be directly bonded.

In the above-mentioned first example, the breakage of the substrates at direct bonding is prevented by lowering the temperature of a heat treatment to 400° C. Since the thermal expansion occurs roughly in proportion to the treating temperature, lowering the treating temperature donates to prevent the breakage of the substrates. On the other hand, lowering the treating temperature causes a possibility of incomplete bonding owing to an insufficient migration and rearrangement of atoms at bonding interface. Since a process for preparing a bonding type semiconductor substrate is applied to a preparation of LED in the present example, it is required that joining strength is enough at LED preparing processes and electric current can be applied across the bonding interface. In the first example, the joining strength obtained through the heat treatment at 400° C. was found to be enough for preparing LED according to the present invention. For evaluating electric resistance at the direct bonding interface, voltage VF was measured when a constant current of 20 mmA was applied in normal direction. At that time, in order to reduce contact resistance of the electrode, a GaAs contact layer was placed between the cladding layer and the electrode using an etching layer shown in FIG. 4. Among the LEDs prepared in the first example, VF of those treated at 800° C. was 2.0 V on average and 2.1 V at maximum and was the same as that of the conventional LED. On the contrary, VF of the LEDs treated at 400° C. was 2.1 V on average which was almost the same, but 3.2 V at maximum. The large value shows presence of insufficient part at direct bonding. The result of the measurement suggests that perfection of bonding is sometimes not compatible with decrease of difference of thermal expansion between the wafers by lowering the treating temperature.

The following explains the present example of preparing a bonding type semiconductor substrate with reference to FIG. 4. FIG. 4A shows an epi-wafer to be used in the process of the present example. The epi-wafer is different from the epi-wafer shown in FIG. 2A at the point that an etching-stopping layer 33 is formed between a GaAs layer 38 and an GaAs substrate 32, the rest being substantially the same. The etching-stopping layer 33 is made of InAlP having a thickness of 0.2 μm. As a GaP wafer mentioned below, substantially the same one as in the first example is used.

First, as shown in FIGS. 4A to 4D, the steps until bonding at room temperature among the steps for direct bonding were conducted in a similar manner as in the first example.

Figure 4A:
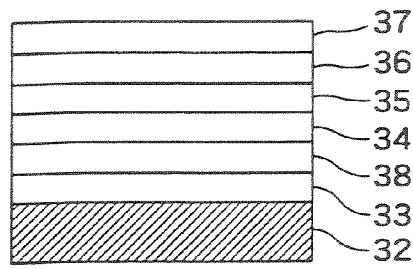
FIGS. 4A-4F are schematic cross-sectional views showing the third example of the preparation process of the bonding type semiconductor substrate according to the present invention.
Figure 4B:
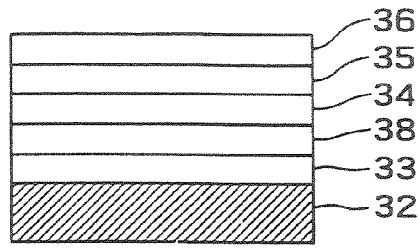
Figure 4C:
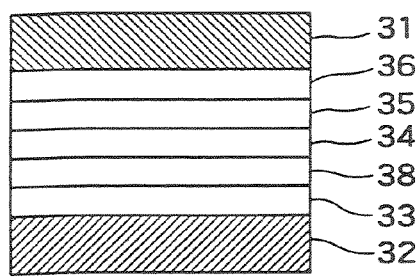
Figure 4D:
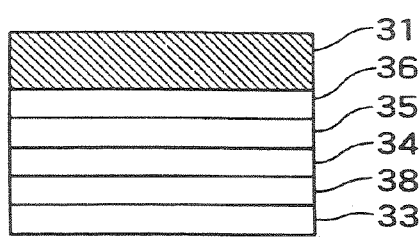

Then, the GaAs substrate was removed prior to the heat treatment. This point is the characteristic of the present invention. The closely bonded substrate shown in FIG. 4C was dipped in a mixture of ammonia and aqueous hydrogen peroxide to remove the GaAs substrate 32 by etching. Since the etching solution does not etch InAlP, after the etching, the etching-stopping layer 33 remains as shown in FIG. 4D.

After removed the GaAs substrate 32, a similar heat treatment as in the first example was conducted. The treating temperature was 800° C. that was a higher one of the two temperatures used in the first example.

Figure 4E:
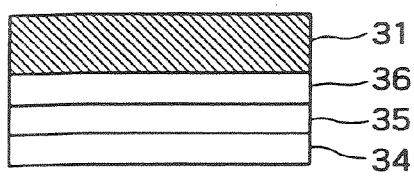
Figure 4F:
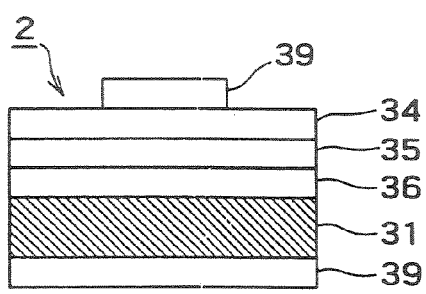

Then, the etching-stopping layer 33 was removed, as shown in FIG. 4E, by etching it with a mixture of phosphoric acid, aqueous hydrogen peroxide, and water. Moreover, the GaAs layer 38 was removed by etching it with a mixture of sulfuric acid, aqueous hydrogen peroxide, and water, a part of which was still remained. Furthermore, as in the first example, LED 2 shown in FIG. 4F was obtained by placing the electrodes 39 on the lower surface of the GaP substrate 31 and on the upper side of the n-type cladding layer 34 where the GaAs layer 38 was remained. The remaining GaAs layer 38 acts as a contact layer.

Upon the heat treatment at 800° C., any of the five pieces of the bonded substrate was not broken and no crack was observed in the present example, though three of the five pieces were broken in the first example. Moreover, as for the properties of LED 2 obtained in the present example, both of the brightness and VF were the same as those prepared from the bonded substrate which was not broken at the heat treatment at 800° C. among the bonded substrate of the first example.

The reason for avoiding the breakage of the bonded substrate at the heat treatment resulted in from removal of the GaAs substrate 32 of the epi-wafer prior to the heat treatment is as follows. Namely, the breakage of the bonded substrate is due to the difference between the thermal expansion coefficient of the epi-wafer and that of the GaP substrate 31. Since the volume of the epi-wafer is mostly composed of the GaAs substrate 32, average thermal expansion coefficient is almost equal to that of GaAs. Since GaAs has larger thermal coefficient than GaP has, average thermal expansion coefficient of the epi-wafer is also larger than that of the GaP substrate 31. On the other hand, the epitaxial growth layer side of the epi-wafer warps convexly, though the lattice constant of the epitaxial growth layer is matched with the GaAs substrate 32. This fact means that the thermal expansion coefficient of the epitaxial growth layer is smaller than that of the GaAs substrate 32. Therefore, when the GaAs substrate 32 is removed from the epi-wafer, average thermal expansion coefficient of the epi-wafer becomes that of the epitaxial growth layer which is close to that of the GaP substrate 31. As the result, the breakage of the bonded substrate does not occur even when it is subjected to the heat treatment. Accordingly, without removal of the entire GaAs substrate 32 prior to the heat treatment, average thermal expansion coefficient of the epi-wafer comes close to the GaP substrate 31, and thereby the breakage of the bonded substrate is prevented.

Furthermore, in the present example, the etching-stopping layer 33 is utilized so that the n-type cladding layer 34 may not be exposed during the heat treatment. This aims to prevent the possibility of evaporation of P (phosphorus) having a high vapor pressure upon heating an InGaAlP material at a high temperature, so called phosphorus-escape. It is desirable not to expose the epitaxial growth layer participating directly the emission of the active layer and cladding layer during the heat treatment.

Regarding direct bonding between a different kind of materials, the present inventors proposes in Japanese Patent No. 2801672 a method which comprises subjecting to the heat treatment at a low temperature, making one of the wafers thin, and then subjecting to the heat treatment at a high temperature. This method includes, by making one wafer thin, reducing thermal stress added to another wafer, and does not relates to reduction of thermal stress through changing the average thermal expansion coefficient of the whole epi-wafer.

Also by the preparation process of the bonding type substrate regarding the present invention, it is possible that the heat treatment is conducted at a low temperature to obtain a predetermined bonding strength, and an epitaxial wafer substrate is subsequently removed, followed by the heat treatment at a predetermined high temperature. However, in the case where the electrical characteristics of the bonding faces are taken into consideration as in this embodiment, the low-temperature heat treatment is preferably conducted at a low temperature of 100 to 300° C. or lower. This reason is as follows. As the dehydrogenation/condensation reaction proceeds, the bonding strength increases, but at the same time, the amount of desorbed water content also increases. In the case that the bonding reaction is completed while the temperature is raised as it is, any problem is not present, but once the heat treatment is stopped, the water content is fixed on the bonding interface, so that even when the temperature is raised again, the electrical characteristics are more likely to be affected adversely.

Third Embodiment

Next, the following will describe the third embodiment of the present invention as well as a comparative example. This embodiment is characterized in that a high performance LED can be realized by sandwiching a light emitting body with two transparent substrates and by bonding them so that the bowing or cracking of the wafer is prevented certainly and easily.

First, the embodiment of the present invention is described herebelow.

FIGS. 5A through 5F exemplarily show the process for fabricating a green light emitting element according to the embodiment.

Figure 5A:
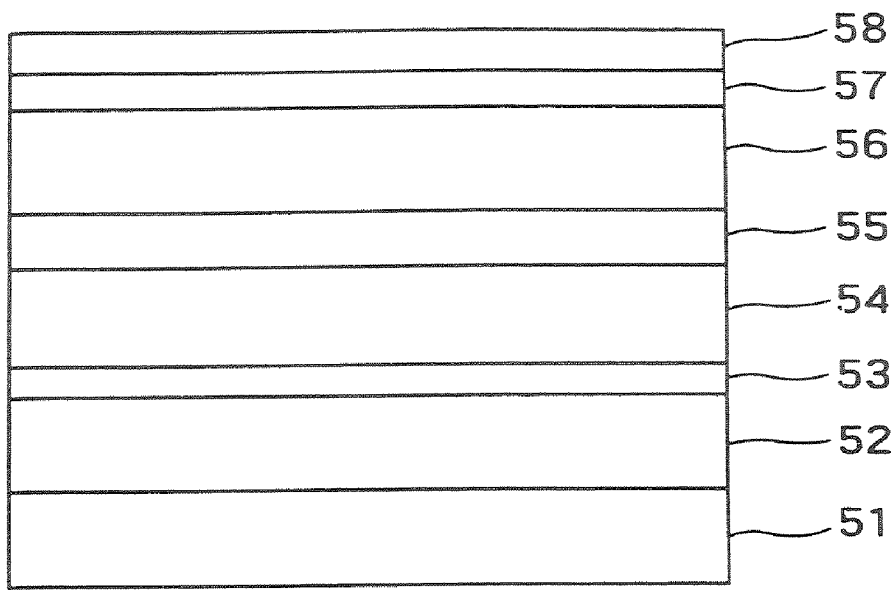
FIGS. 5A through 5F exemplarily show the process for fabricating a green light emitting element according to the third embodiment.

First, as shown in FIG. 5A, a n-type GaAs layer 52 having a thickness of about 0.5 μm is grown on the GaAs substrate 51 having a thickness of about 250 μm. Then, a n-type $In_{0.5}Ga_{0.5}P$ layer 53 having a thickness of 0.2 μm, n-type cladding layer $In_{0.5}Al_{0.5}P$ 54 having a thickness of about 0.6 μm, a p-type active layer $(In_{0.5}(Ga_{0.55}Al_{0.45})_{0.5}P$ with a impurity concentration of about $5\times10^{16}$–$2\times10^{17}$ cm$^{-3}$) 55 having a thickness of about 1.0 μm, a p-type cladding layer $In_{0.5}Al_{0.5}P$ 56 having a thickness of about 1.0 μm, a p-type etching-stop layer (GaAs) 57 having a thickness of about 0.01 μm, a n-type cap layer $In_{0.5}(Ga_{0.7}Al_{0.3})_{0.5}P$ 58 having a thickness of about 0.02 μm are grown in this sequence. Thus, the light emitting body is formed in a single batch of epitaxial growth.

Figure 5B:
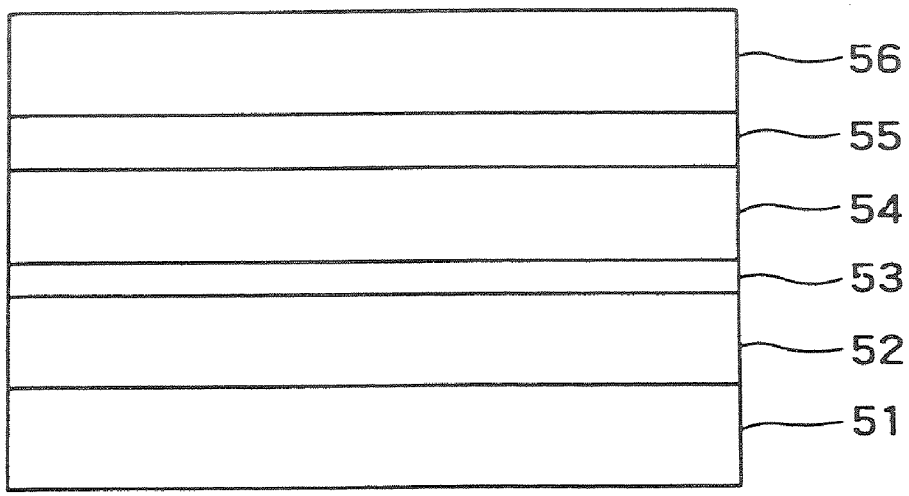
Figure 5C:
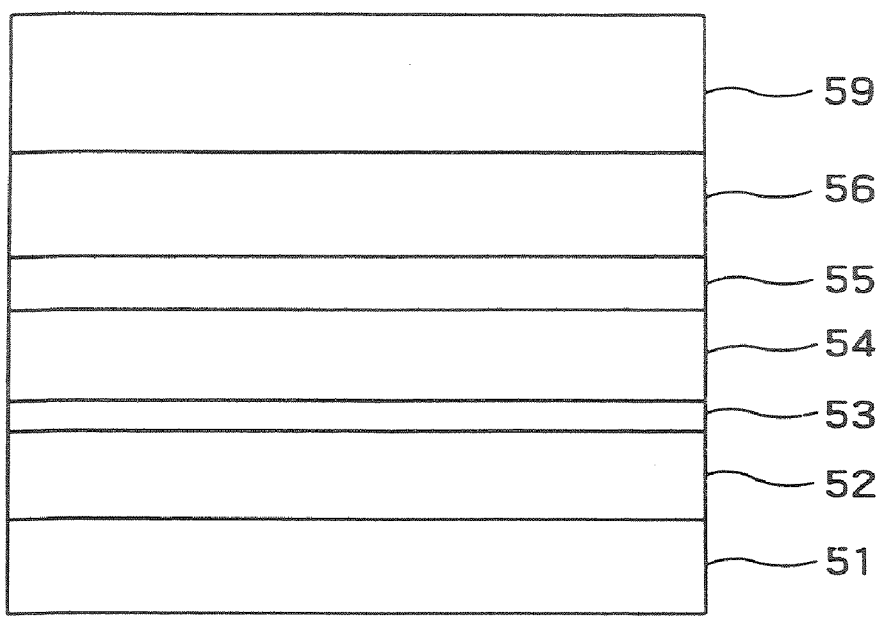

Next, as shown in FIG. 5B, the n-type cap layer 58 and p-type etching-stop layer 57 are etched and the p-type cladding layer 56 is exposed. Then the native oxide and the particles (not shown) on the surface of the cladding layer 56 are removed. The native oxide and the particles on the surface of the p-type transparent substrate (GaP substrate) 59, which is shown in FIG. 5C, are also removed. The substrate 59 is prepared in a separate process from the light emitting body.

Then, as shown in FIG. 5C, the p-type transparent substrate 59 having a thickness of 250 μm, for example, is placed on the surface of the cladding layer 56 in a close contact at room temperature.

Figure 5D:
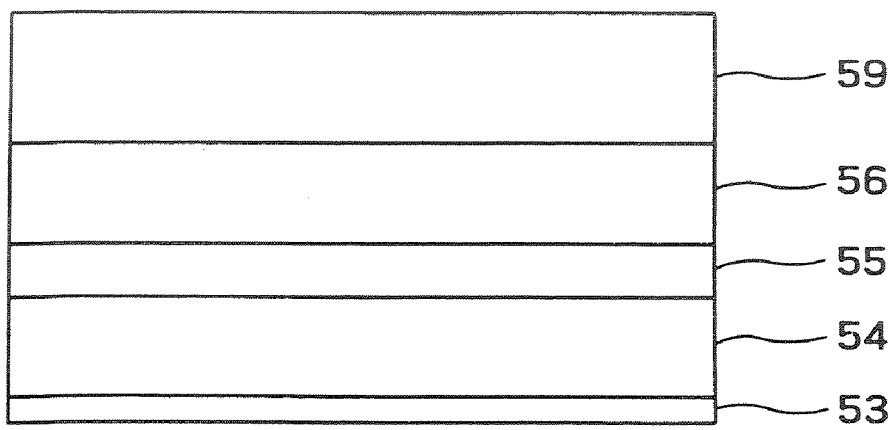

Next, as shown in FIG. 5D, the GaAs substrate 51 and the GaAs layer 52 are removed by an appropriate etching process.

Figure 5E:
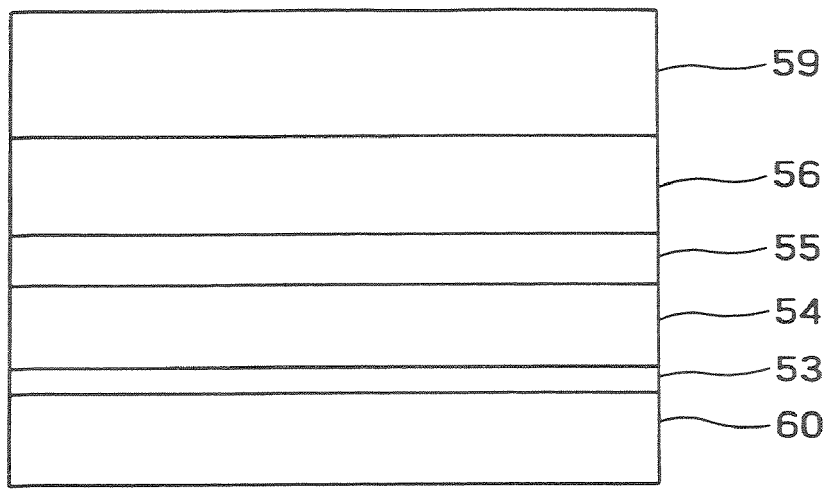

Next, the native oxide and the particles on the surface of the n-type transparent substrate (GaP substrate) 60, which is shown in FIG. 5E, are removed. This substrate 60 is also prepared in a separate process from the light emitting body.

Then, as shown in FIG. 5E, the n-type transparent substrate 60 having a thickness of 250 μm, for example, is placed on the surface of the layer 53 in a close contact at room temperature.

Next, the substrate 59 and the layer 56 as well as the substrate 60 and the layer 53 are bonded at a high temperature by heating up to 800° C., for example, in a flow of argon (Ar) gas. Then the wafer is cooled down to the room temperature. According to the invention, the bonding temperature is not limited to the specific temperature of 800° C., and the temperature may preferably in a range of 500-1200° C.

Figure 5F:
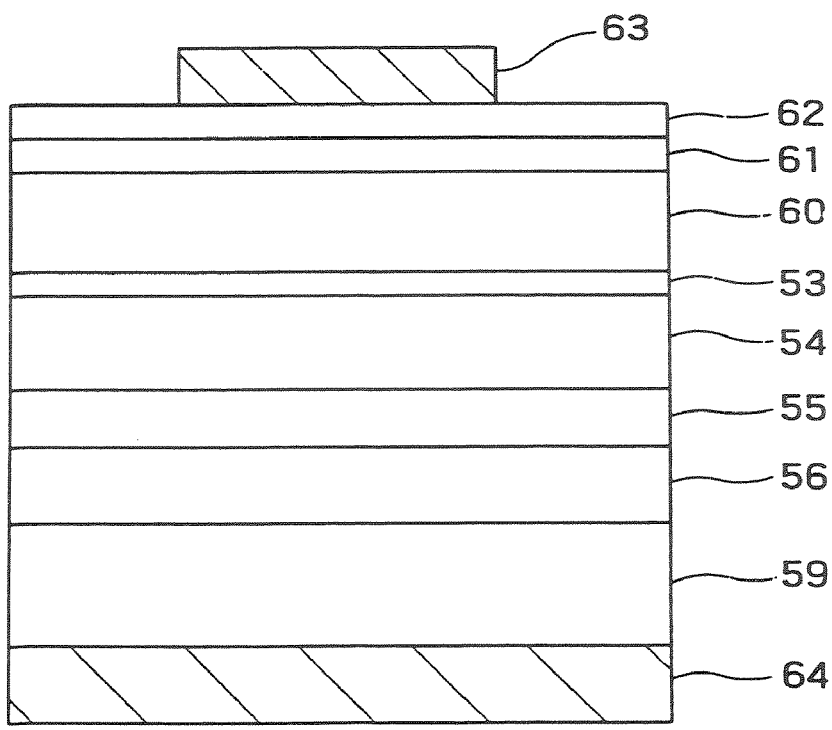

Next, as shown in FIG. 5F, an intervening layer 61 made of gold (Au) including germanium (Ge) (AuGe including 0.5% of Ge, for example) having a thickness of 1-10 nm is formed on the substrate 60.

Then, a transparent electrode 62 made of ITO (a mixture of indium oxide and tin oxide) is formed. In this formation process, the substrate temperature may preferably be at room temperature (around 22° C.) and the ratio of the flow rate of argon and oxygen be around 100:1, for example, and the total pressure may preferably be set around $1\times10^{-3}$ Torr.

Then, a metal electrode 63 made of gold (Au), for example, is formed on the transparent electrode 62, and a backside electrode 64 made of gold-beryllium (AuBe) including 1% of beryllium, for example, is formed on the surface of the substrate 59. The wafer is then annealed at 450° C. for 15 minutes, for example.

The wafer is then scribed into LED chips. These chips are encapsulated in a resin mold package, for example. Thus, the fabrication process of the light emitting element according to the embodiment is completed.

Next, the following describes the comparative example of the embodiment.

FIGS. 6A through 6G show the comparative process for fabricating a green light emitting element, which the inventors have conducted.

Figure 6A:
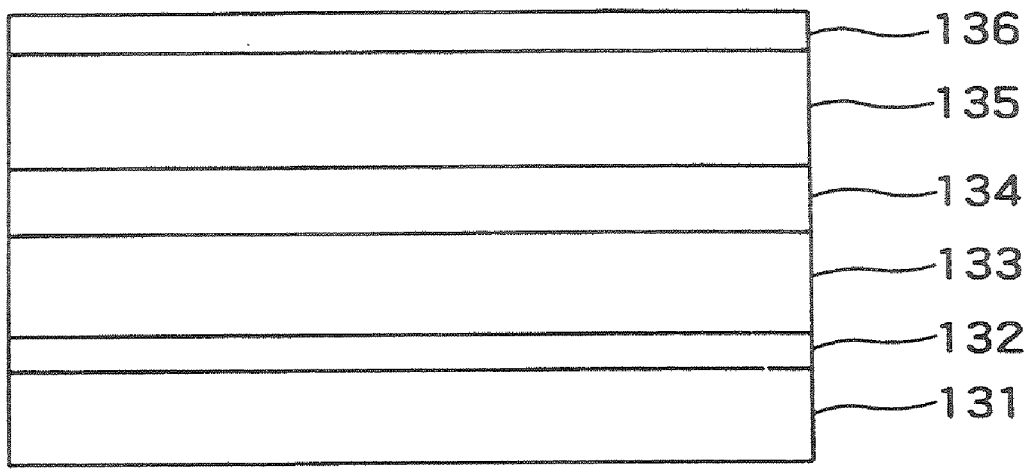
FIGS. 6A through 6G show the comparative process for fabricating a green light emitting element, which the inventors have conducted.

First, as shown in FIG. 6A, an etching-stop layer 132 is grown on the GaAs substrate 131. Then, a p-type cladding layer 133, an active layer 134, a n-type cladding layer 135, a cap layer 136 are grown in this sequence. Thus, the light emitting body is formed by the epitaxial growth.

Figure 6B:
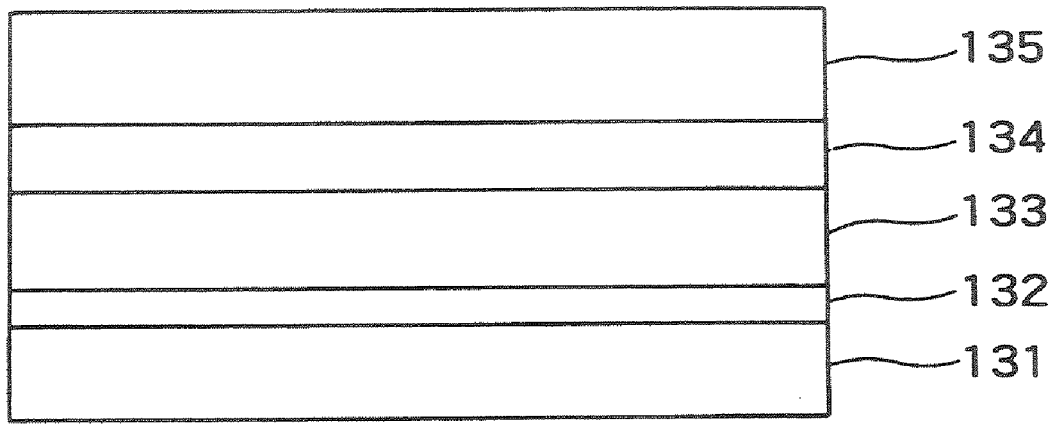

Next, as shown in FIG. 6B, the cap layer 136 is etched and the n-type cladding layer 135 is exposed.

Figure 6C:
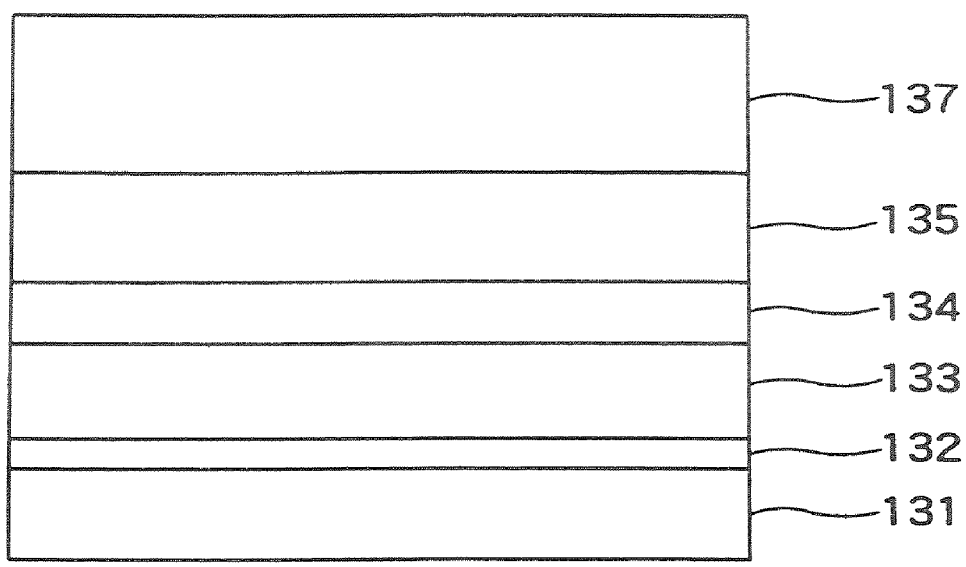

Then, as shown in FIG. 6C, a n-type transparent supporting layer 137 having a thickness of 10-50 μm is epitaxially grown on the surface of the cladding layer 135.

Figure 6D:
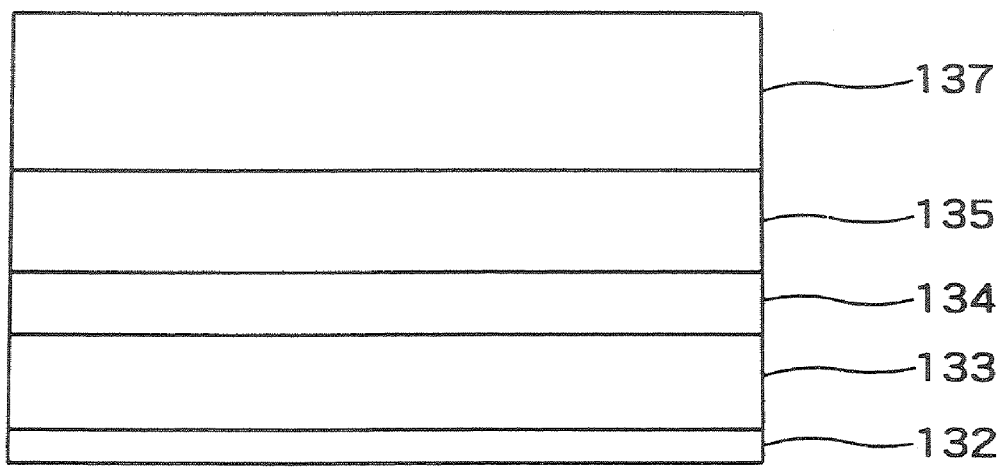

Next, as shown in FIG. 6D, the GaAs substrate 131 is removed and the etching-stop layer 132 is exposed by an appropriate etching process.

Figure 6E:
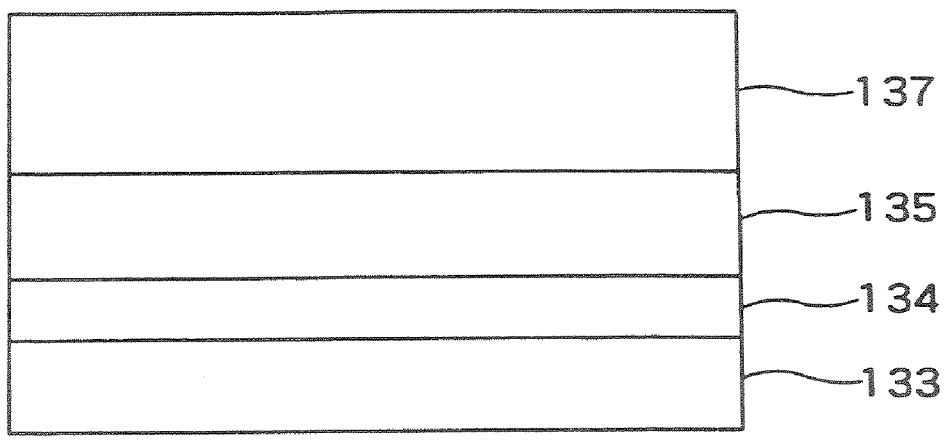

Then, as shown in FIG. 6E, the etching-stop layer 132 is removed by an appropriate etching technique and the cladding layer 133 is exposed.

Figure 6F:
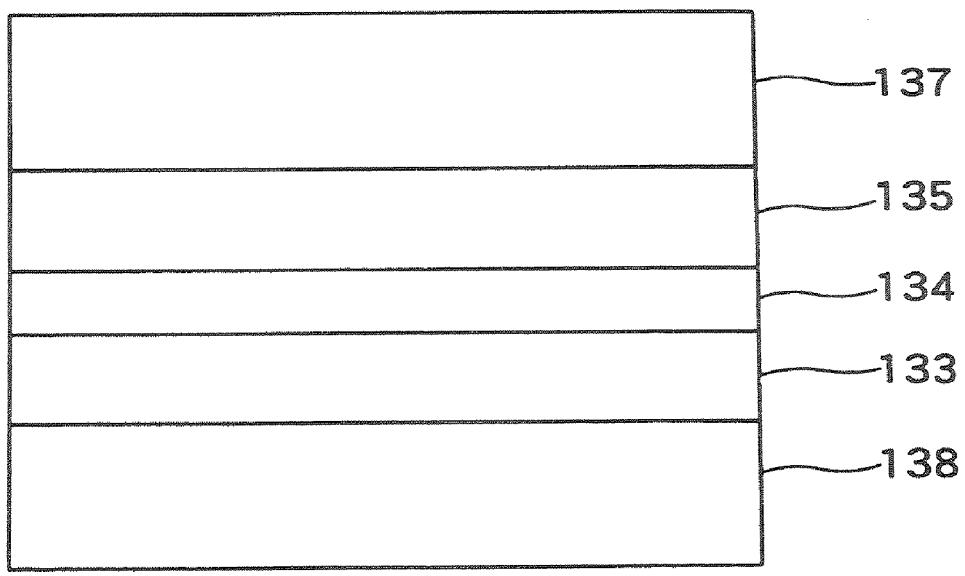

Next, as shown in FIG. 6F, a p-type transparent substrate 138 having a thickness of about 250 μm is bonded onto the cladding layer 33 by pressing them at high temperature.

Figure 6G:
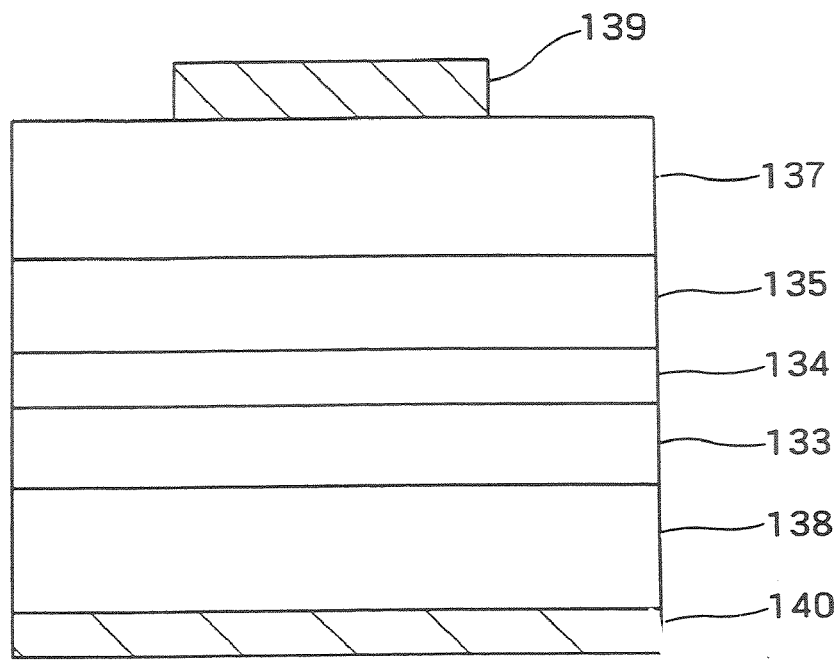

Next, as shown in FIG. 6G, a metal electrode 139 is formed on the supporting layer 137, and a metal electrode 140 is formed on the surface of the substrate 138. Thus, the fabrication process of the comparative light emitting element is completed.

Figure 7:
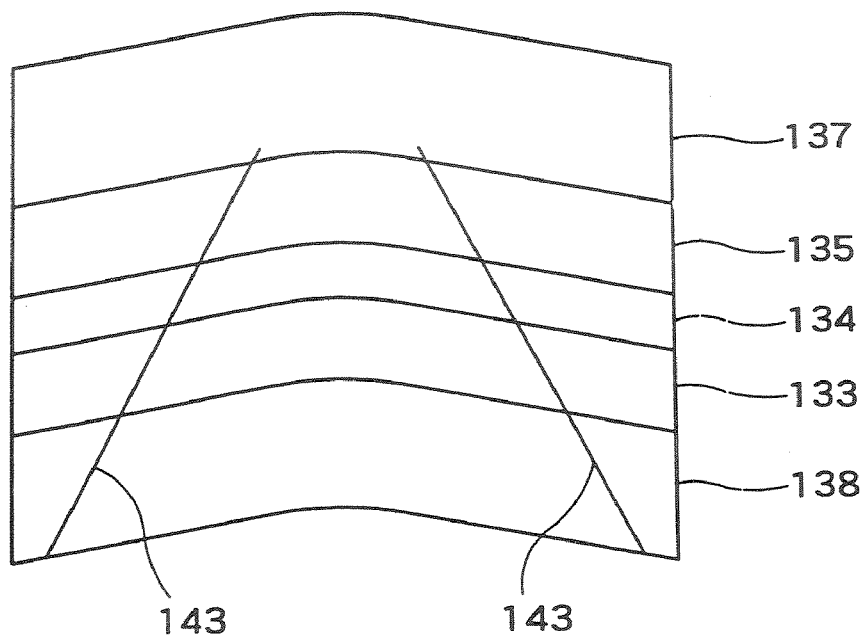
FIG. 7 shows that the wafer prepared by the comparative process bows and the cracks 143 occur.

In the case of the above-explained comparative example, the substrate is need to be bonded by pressing them at high temperature in order to obtain a good ohmic contact at the interface between the p-type cladding layer 133 and the transparent substrate 138. However, since the epitaxially grown supporting layer 137 is considerably thinner than the substrate 138, the stress due to the difference of the thermal expansion between the cladding layer 135 and the supporting layer 137 becomes smaller than the stress between the cladding layer 133 and the substrate 138. In other ward, the stresses at the upper and lower sides of the wafer do not balance. As a result, the wafer bows as exemplarily shown in FIG. 7, and the cracks 143 occur. Thus, the emission characteristics of the LED degrades remarkably.

If the supporting layer 137 is grown as thick as the substrate 138, the above-explained problem may be solved. However, that is an unrealistic solution since it takes enormous long time to grow such a thick layer by an epitaxial growth technique.

In contrast to this situation, the light emitting devices comprising a bonded structure can be successfully obtained without any bowing or cracks.

That is, according to the embodiment, the transparent substrate 59 is bonded to the cladding layer 56 and the substrate which is made of the same material and has the same thickness as the substrate 60 is bonded to the cladding layer 54 via the layer 53. In other ward, the substrates 59 and 60 are made of the same material and have a essentially same thickness. Thus, the thermal stress between the cladding layer 56 and the substrate 59 balances the thermal stress between the cladding layer 54 and the substrate 60, even if the wafer is cooled down to a room temperature after the bonding process at a high temperature. As a result, the bowing or cracks of the wafer is effectively prevented.

Figure 8:
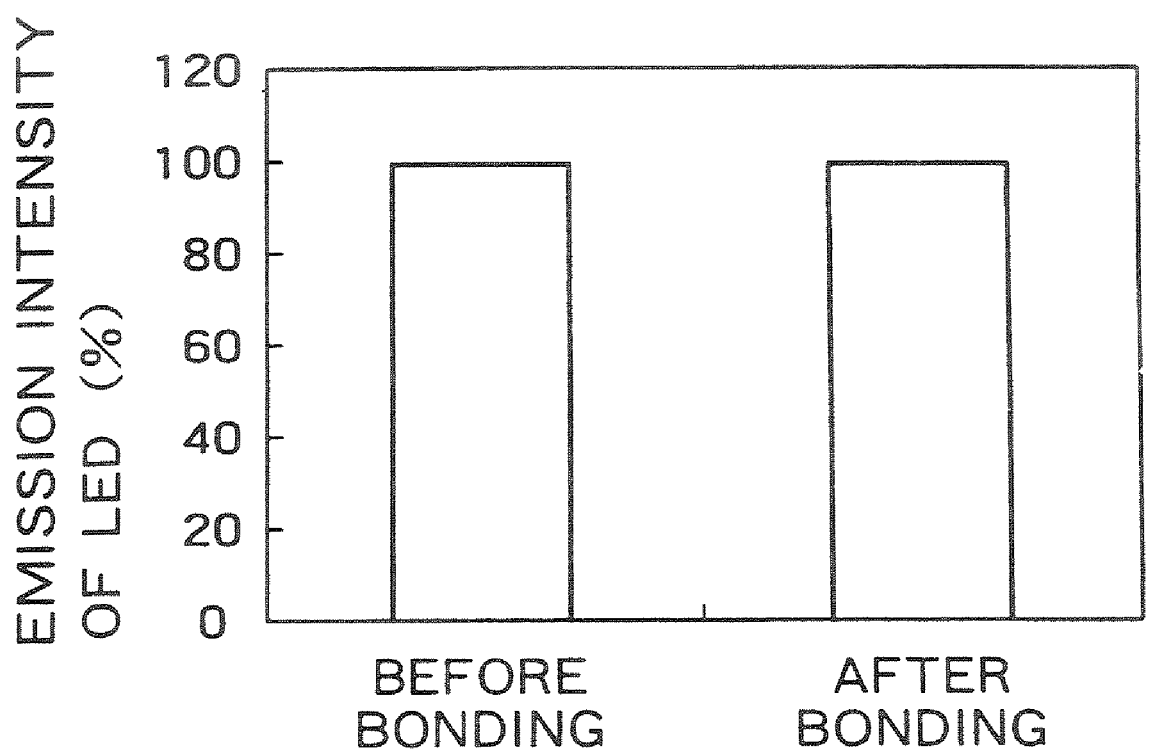
FIG. 8 shows the measured emission intensities taken from the light emitting body of the LED before and after bonding the substrates 59 and 60 in the third embodiment of the present invention.

FIG. 8 shows the measured emission intensities taken from the light emitting body of the LED before and after bonding the substrates 59 and 60 in the third embodiment of the present invention. As shown in the figure, the emission intensity does not decrease and the performance of the LED is kept even after the bonding process.

It also found to be preferable to keep the temperature in a range of 500-1200° C. during the bonding in order to obtain the good ohmic contact at the interface between the light emitting body and the substrates 59 and 60.

Besides, according to the embodiment, since the light emitting body is sandwiched by the two substrates 59 and 60, it takes much shorter time to fabricate the structure as compared to the comparative example where the supporting layer 137 needs to be epitaxially grown for a long time.

In the case of the embodiment shown in FIGS. 5A-5F, the substrates 59 and 60 can be quite easily made thicker, up to about 250 μm for example, without a need for a long-lasting epitaxial growth. By making the substrates 59 and 60 thicker, the side surfaces of these substrate become broader. As a result, the output intensity of the LED can be increased because the broad side surfaces of the substrates reflect the light from the light emitting body toward the emission surface of the LED.

While the above description is made in a case of a green light emitting LED, the invention is not limited in the specific example. The invention can also be useful for light emitting devices having a emission wavelength other than green band. Also, the transparent substrates usable in the present invention are not limited to the GaP substrate. Other substrates usable are, for example, the ones conductive and transparent enough at the desired wavelength (the preferred transparency may be larger than 90%) such as a GaN substrate.

Forth Embodiment

Next, the following will describe the forth embodiment of the present invention. This embodiment is characterized in that two wafers are aligned at their bonding so that from a crystallographic viewpoint, "the back side" of one wafer may be joined to "the top side" of the other wafer.

FIG. 9 is a schematic view explaining how to bond substrates according to this embodiment.

That is to say, the semiconductor substrates are usually obtained by slicing off a single crystalline ingot exemplified in FIG. 9A in a predetermined crystal orientation.

Heretofore, as shown in FIG. 9B, the respective top surfaces 111A and 111B of the wafers 111 and 112 obtained by slicing off the ingot IG are mirror-polished, and an epitaxial layer or the like is then formed on the mirror-polished surfaces, if necessary. Afterward, the two wafers are bonded to each other, with the respective top sides 111A and 112A facing to each other.

Here, with regard to the resistance of an bonding interface, there is a difference between the mutual bonding of silicon (Si) and the bonding of compounds. That is to say, in the case of the mutual bonding of silicon (Si), irrespective of the crystal orientation of the wafers for bonding, the interface does not have the electric resistance, as far as the carrier concentration of the bonding faces is set to a high level and a heat treatment temperature for the bonding is selected in an appropriate range. For example, even when a (111) face is bonded to a (100) face, the interface resistance is not present, if the wafers with the (100) face is rotated 45 degrees with respect to each other.

On the other hand, in the case of the bonding of compounds, particularly the wafers for an LED, the resistance occurs at the interface, if the carrier concentration is not set a high level and the face orientations between the wafers for bonding are not matched with each other, in order to prevent. In order to decrease the interface resistance in consideration of this phenomenon, a method is proposed in U.S. Pat. No. 5,661,316 in which the wafers having the same inclination angle to a crystal direction are bonded to each other, with the directions of the crystal rotation being matched with each other without rotating these wafers.

On the contrary, the present inventors have tried the bonding in various combinations of crystal directions, and as a result, it has been found that a technique of merely matching the inclination of the wafer and the rotating direction is insufficient, and particularly in the case of the wafers having the faces inclined to the crystal, it is remarkably effective for the decrease of the interface resistance that "the top side" face of one wafer is bonded to "the back side" face of the other wafer.

That is to say, in this embodiment, as shown in FIG. 9C, the wafer 111 is bonded to the wafer 112 in such a manner that the former wafer's back side face 111B may face to the latter wafer's top side face 112A. The Inventor has found that, as mentioned later, such an bonding method improves the crystallinity of the bonding interface and largely reduces an electrical resistant component.

In the case of group-III to group-V compound semiconductors having a zinc blende structure, for example, as shown in FIG. 9A, a monochrystalline ingot IG grown in a [100] direction has two directions of one in which a (111) A face appears and the other in which a (111) B face, both faces being inclined with respect to its grow axis. The (111) A face here refers, for example, an atomic plane in which group-III elements appear on the top side dominantly and the (111) B face, an atomic plane in which group-v elements do so.

Thus, the top sides of the semiconductor substrates 111 and 112 obtained by slicing that monocrystalline ingot at a predetermined angle with respect to its (111) A face become faces 111A and 112A respectively on which the physical properties of the (111) A face appear dominantly. While their back sides 111B and 112B, on the other hand, become those on which the physical properties of the (111) B face appear dominantly.

The reason why the crystal is inclined when it is sliced off is that it is convenient in epitaxial growth with a substrate having an inclined top side orientation than with a so-called "just" orientation type substrate, so that in general, the (100) face is inclined in a (111) face direction. In the case of such compound semiconductors as GaAs or GaP, however, as mentioned above, there are two types of (111) faces of one covered with Ga, a group-III element, and the other covered with As or P, a group-V element. It is known that when a wafer is made by processing a crystal so as to make such a (111) face the top side, this top side and the back side are different from each other in physical properties.

As shown in FIG. 9, for example, if the ingot is sliced so that the top side may be inclined to the (111) group-III face, the back side is inclined to the (111) group V face. As shown in FIG. 9C, therefore, bonding two semiconductor substrates so that the top side of one substrate may face to the back side of the other indeed means bonding the side inclined to the (111) group III face to the side inclined to the (111) group V face.

The side of the (100) face inclined in the (111) group III face direction has (100) faces and (111) faces in mixture and has a higher proportion of group III atoms, while the side inclined in the (111) group V face direction, on the other hand, has a high proportion of group V atoms. Conversely, the face inclined in the (111) group V face has a higher proportion of group V atoms. By combining both, the ratio between the group III and group V atoms can be maintained at the bonding interface to reduce dangling bonds which adversely affect the electrical characteristics, thus lowering the electric resistance.

Therefore, when two semiconductor substrates to be bonded to each other are of the same material, preferably they have approximately the same inclination angle of the top side. With this, a best balance is provided between the group III and group V atoms.

To bond semiconductor substrates to different materials, on the other hand, preferably the top side inclination angle is also adjusted, taking into consideration their physical properties. This is because different materials may have different proportions of group III and group V atoms with respect to the inclination angle.

Also, in the case of semiconductor substrates having a top side with small inclination angle (off-angle) in a direction (e.g., <111> direction for GaAs or GaP) in which anisotropy appears, even when their top sides are combined, the number of the dangling bonds is few and the increase in the interface resistance tends to be relatively suppressed When the inclination angle is 10 degrees or more, on the other hand, the back side and the top side can be combined to obtain remarkable effects.

According to the results of the discussion by the present inventors, even when bonding the substrates having in their top side a (100) just face with a inclination angle of e.g. 0 degree, the back side and the top side can be bonded to obtain effects. The (100) face has conventionally been considered to be electrically equivalent on both the back side and the top side. However, group III and group V compound semiconductors such as GaAs and GaP have a zing blende structure and their group III and group V atoms arranged at their respective face-centered cubic lattice positions different from each other in such a configuration that the respective lattices are shifted from each other by ¼ a lattice constant in a diagonal direction. It is therefore assumed that in the (100) face, one of the group-III atom or the group-V atom appears on the surface of the top side and the other stays deep inside by as much as ¼ of the lattice length from the top surface. In this case, on the back side of the substrate, the other of the atom existent on the surface of the top side appears to maintain electric neutrality. For this reason, it seems that, even with the (100) just face, the top side and the back side should preferably be combined in bonding in order to reduce the number of the dangling bonds and suppress an increase in the interface resistance.

This embodiment provide almost the same remarkable effects even when two semiconductor substrates sliced off from different ingots are bonded to each other.

Figures 10A, 10B, 10C:
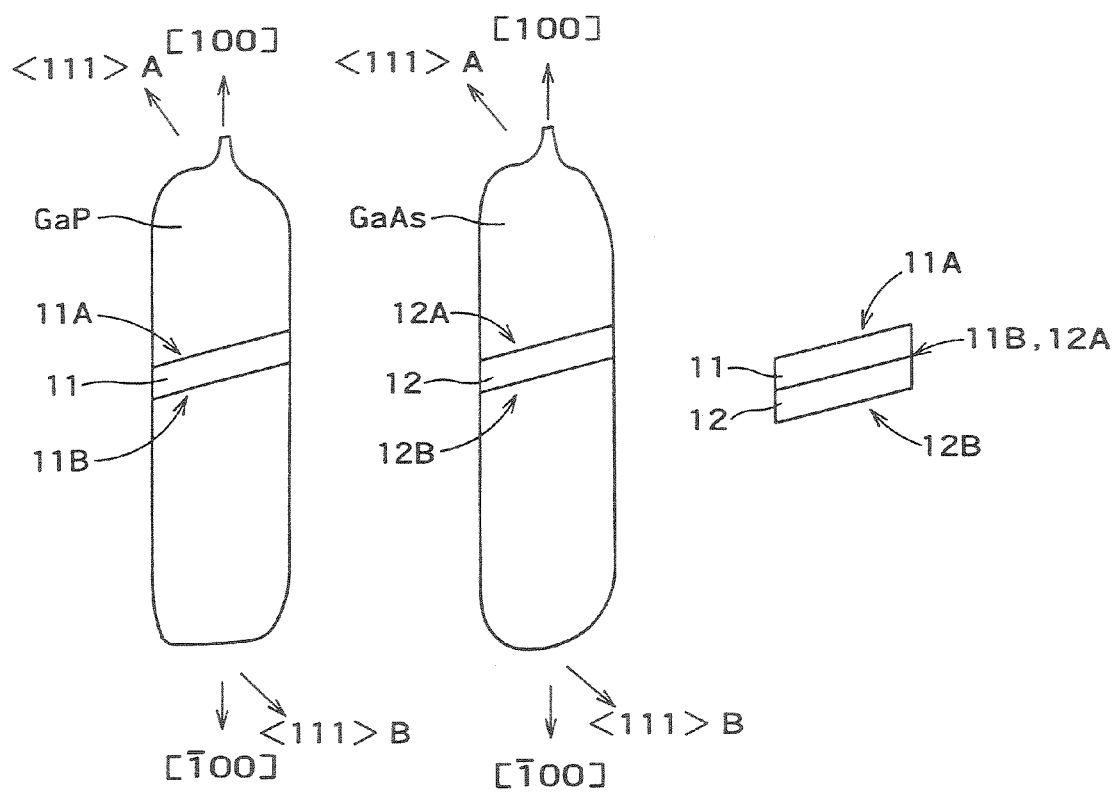
FIGS. 10A-10C are concept diagrams explaining how to mutually bond semiconductor substrates obtained by slicing off two different ingots.

FIG. 10 is a concept diagram showing how to bond two semiconductor substrates sliced off from two different ingots. As shown in FIG. 10A, for example, a semiconductor substrate 11 having an off-angle inclined in the (111) direction is sliced off from a GaP monochrystalline ingot grown in the [100] direction. The semiconductor substrate 11 has a top side 11A on which the (111) A face component appears dominantly and a back side 11B on which the (111) B face component appears dominantly. Similarly, as shown in FIG. 10B, a semiconductor substrate 12 sliced off with an off-angle from the GaAs ingot also has a top side 12A on which the (111) A face component appears dominantly and a back side 12B on which the (111) B face component appears dominantly.

When bonding these two substrates to each other, the back side 11B and the top side 12A face to each other in bonding. Also, the top side 11A and the back side 12B are bonded to each other. Thus, by bonding the top and back sides to each other, a good balance between the group-III and group-V atoms can be obtained at the interface, thereby decreasing the number of the dangling bonds and the crystal defects as well as largely reducing the electric resistance.

Note here that a decision between "the top side" and "the back side" of semiconductor substrates sliced off from different monocrystalline ingots can be made on the basis of its direction with respect to direction of growing the ingot, i.e. the seed crystal. That is to say, when an ingot is grown generally, the crystal orientation of the seed crystal is set constant. Therefore, even with different ingots, their (111) A face or (111) B face direction has a constant relationship with respect to the growing direction. That is to say, even for two semiconductor substrates sliced off from mutually different ingots, the side of both of them which is nearer to the seed crystal may be defined to be "the top side" face and the opposite side, to be "the back side" face, to thereby bond each other.

A typical compound semiconductor wafer commercially available often has at a portion thereof a straight cutting, refereed to as "an index flat (IF)". With this, "the top side" and "the back side" of a wafer can be easily identified.

"The top side" and "the back side" of semiconductor substrates sliced off from different ingots can also be decided by mesa etching. That is to say, a GaAs or GaP wafer, when subjected to mesa etching, would have a forward mesa and a backward mesa of its cross-sectional geometry which intersect with each other at a right angle. Also, between the top and back sides of each wafer thus etched, their forward mesas go orthogonal. The direction of these forward and backward mesas appears corresponding to the orientation of the respective (111) A and (111) B faces of the crystal. Therefore, based on these forward mesa and backward mesa directions, the top and back sides of the semiconductor substrate can be discriminated from each other.

When two semiconductor substrates are bonded, with their respective top and back sides facing to each other, the forward mesa directions of thus bonded sides intersect orthogonal with each other, so that between the mutually opposite sides of the thus bonded substrates, i.e. between one side and the other side of this new wafer obtained by bonding these two wafers into one, their respective forward mesa directions intersect with each other orthogonal.

Next, the examples of this embodiment are specifically described with as the fourth through sixth example of the invention.

FOURTH EXAMPLE

First, as a fourth example, a specific example is described where the interface resistance of bonded wafers was measured.

As shown in FIG. 9, the Gap wafers 111 and 112 were sliced off as inclined 15 degrees in the (111) direction from the GaP monochrystalline ingot grown in the {100} direction. Thus sliced off wafers 111 and 112 were classified into two groups in such a way that the first group of the wafers were, as shown in FIG. 9B, polished on the upper faces (top sides) 11A and 112A to provide a mirror face) and the other group of wafers were, as shown in FIG. 9C, polished on the lower faces (back sides) 111B of the wafers 111 and the upper faces (top sides) 112A of the wafer 112. These wafers with the polished top side have their polished faces inclined in the (111) Ga face direction, while the wafers with the polished back side face their polished faces inclined in the (111) P face direction.

These two groups of wafers were bonded with their top sides facing each other and with their top side and back side facing each other, to compare their electrical resistance at the interface.

They were bonded by a method detailed later using the heat treatment at 800° C. On the GaP face to be bonded was grown a GaP epitaxial layer with a changed carrier concentration, to change in adjustment the carrier concentration at the bonding interface to a variety of values. The thus bonded wafer was divided to the bonding face with an electrode provided on both sides thereof into dice with a size of 250 μm□, to measure the I-V characteristics in order to obtain a resistance at the interface by subtracting a bulk resistance of the GaP substrate.

Figure 11:
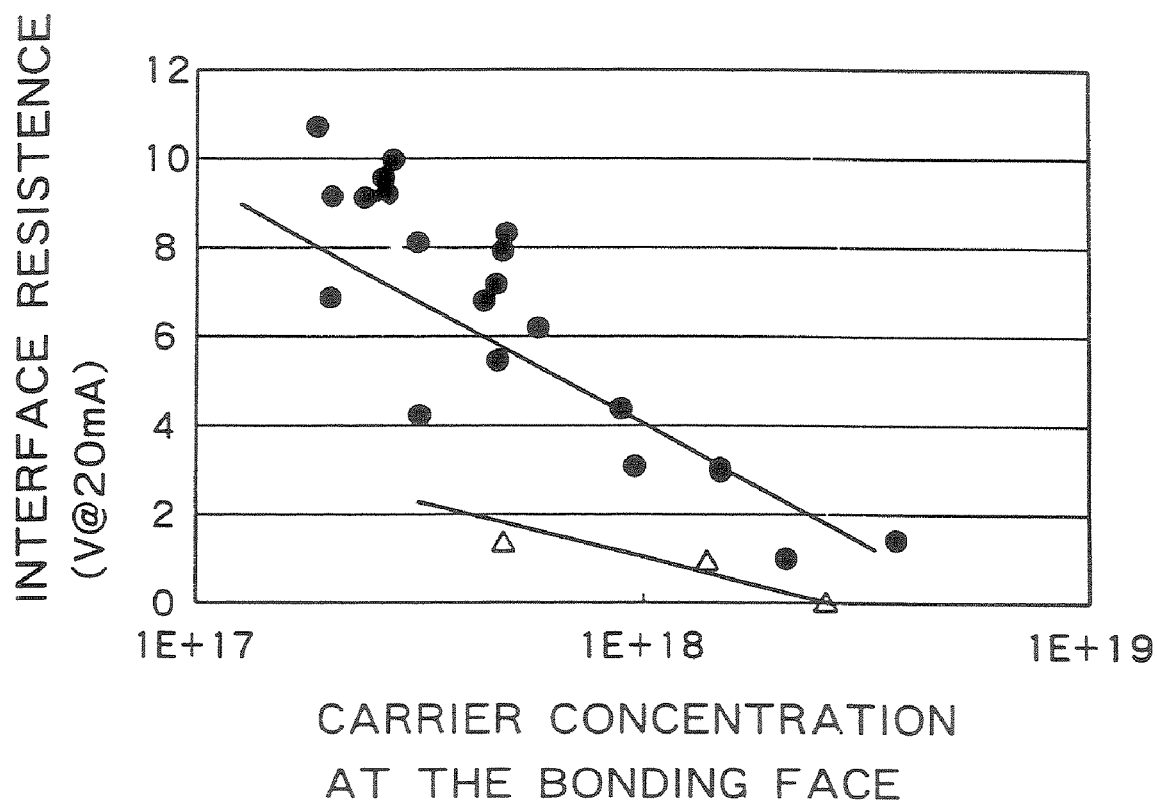
FIG. 11 is a graph showing a relationship between a carrier concentration and an interface resistance of a bonding face.

FIG. 11 is a graph showing a relationship between the carrier concentration at the bonding face and the interface resistance. In this graph, a black circle represents a wafer with the top sides bonded to each other, while a white triangle represents a wafer with the top and back sides bonded to each other. The wafer with the top sides bonded to each other (represented by the black circle) exhibits the decreasing interface resistance with the increasing carrier concentration although that resistance is not reduced to zero. The wafer with the top and back sides bonded to each other (represented by the while triangle) according to the present invention exhibits a very low interface resistance even with a low carrier concentration, so that the interface resistance was successfully reduced to zero when the carrier concentration was raised to around $2 \times 10^{18}$ cm$^{-3}$.

Note here that the relationship between the carrier concentration and the interface resistance stays almost the same even without the epitaxial layer on the top side, so that by using a substrate with a higher carrier concentration, the interface resistance can be lowered even with no epitaxial layer.

FIFTH EXAMPLE

The following will describe the results of a fifth example of evaluating an LED made on a trial basis according to almost the same process as that of FIG. 2.

First, GaAs wafer 12 was prepared as inclined 15 degrees in the (111) Ga face direction, on which was epitaxial-grown as shown in FIG. 2A, LED structures 18-17 made of InGaAlP. The bonding face (top side of a p-type cladding layer 16) of thus obtained quarternary epitaxial wafer is inclined 15 degrees in the (111) Ga face direction like the substrate.

Next, as the GaP wafers 11, two GaP wafers inclined 15 degrees in the (111) Ga face direction were prepared, with one of them having its top side polished and the other having its back side polished.

Then, as shown in FIG. 2C, the polished face of the GaP wafer was bonded to the cladding layer 16.

Then, as shown in FIG. 2D, the GaAs substrate 12 was removed, to check the operating voltage of thus obtained LED.

As a result, the operating voltage was 4.5V of the LED when electrified with 20 mA which had the bonding face of the GaP wafer 11 inclined in the (111) Ga face direction like the GaAs substrate 12. As against this, the operating voltage was remarkably lowered to 2V of the LED when electrified with 20 mA which had the bonding face of the GaP wafer 11 inclined in the (111) P face direction according to the present embodiment, exhibiting a distinct decrease in the interface resistance.

SIXTH EXAMPLE

The following will describe a specific example where wafers having a (100) just top side orientation were bonded to each other.

First, wafers having a (100) just top side orientation were sliced off from an GaP monocrystalline ingot, with its face near to the ingot's seed crystal being defined as the top side. Next, these wafers were mirror-polished on their top side or back side, on which mirror face was epitaxial-grown a GaP layer with a carrier concentration of $1 \times 10^{18}$ cm$^{-3}$ to a thickness of 0.2 μm. In this case, the reason why the carrier concentration of the epitaxial GaP layer was relatively low is that as mentioned with respect to FIG. 11, the lower carrier concentration provides a larger influence of the combination of the bonding faces on the interface resistance and hence relatively easier comparison.

Thus, with the epitaxial layer sandwiched therebetween, the wafers were bonded to each other with their respective top sides or their top and back sides facing each other, to measure the interface resistance.

As a result, the combination with the respective top sides bonded to each other exhibited no Ohmic properties of the current-voltage characteristics at the interface, with a voltage of about 2.2V being generated near the interface when it is electrified with a current of 20 mA. The combination with the top and back sides bonded to each other, on the other hand, exhibited a straight-line-like Ohmic property of its current-voltage characteristics, with a small voltage of 0.8V when it is electrified with a current of 20 mA.

The reason why the combination with the respective tops side bonded to each other exhibited a larger resistance is considered that the dangling bonds trapped carriers, to lower the carrier concentration at the interface. That is to say, it was found that even in the case of the (100) just orientation type substrates, each wafer has its own "top side" and "back side" corresponding to the growing direction of the ingot, so that by bonding "the top side" and the back side" to each other, the interface resistance can be reduced significantly.

Fifth Embodiment

The following will describe the fifth embodiment of the present invention. This embodiment features applying a pressure not to the whole but only part of each of two wafers when bonded to each other, thus relaxing "a shift" due to thermal expansion.

FIG. 12 is a schematic diagram explaining this embodiment. That is to say, the Inventor discussed uniquely how to hold and pressurize the two wafers A and B when they are bonded to each other according to any of the preceding embodiments.

Figure 12A:
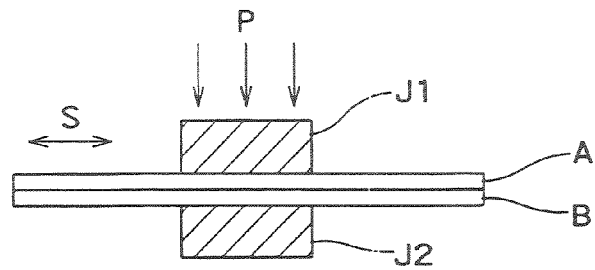
FIGS. 12A-12D are schematic diagrams explaining the fifth embodiment of the present invention.
Figure 12B:
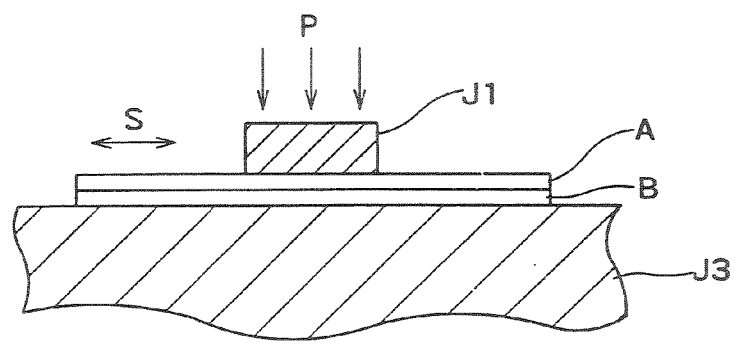
Figure 12C:
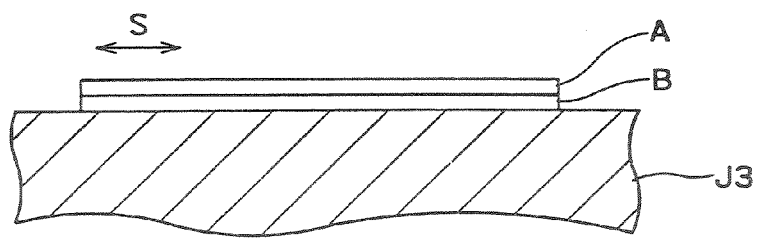
Figure 12D:
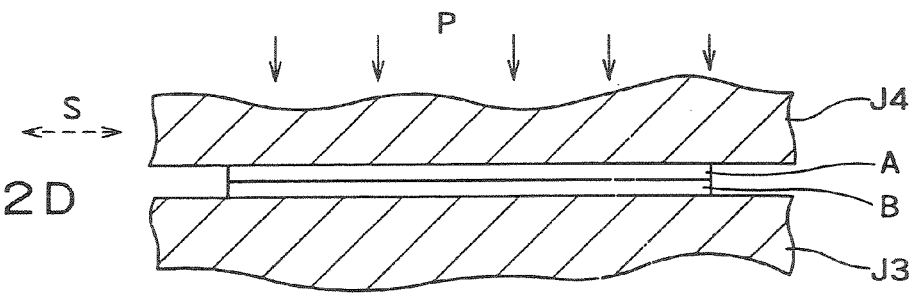

FIGS. 12A and 12B show how to pressure and hod the wafers according to this embodiment, while FIGS. 12C and 12D explain a pressuring/holding method as a comparison example.

First, beginning with the comparison example, as shown in FIG. 12C, the two wafers A and B are put on a sufficiently large jig J3 as superposed one on the other, with no load applied from the above. By such a method, the wafers A and B can be freely expanded in the in-plane direction S, so that there occurs no problems of cracking due to a difference in the thermal expansion coefficient, although the bonding may often be insufficient.

First, as shown in FIG. 12D, the two wafers A and B are held on sufficiently large jigs J3 and J4 respectively and pressured by a load P. In this case, although pressured, the wafers A and B cannot easily be expanded in the in-plane direction, so that "a shift" due to a difference in the thermal expansion coefficient cannot be absorbed and relaxed, thus resulting in wafer cracking in some cases.

As against this, according to this embodiment, as shown in FIG. 12A, the two wafers A and B are not wholly pressured but only respective parts of them are pressed by the load P by use of jigs J1 and J2 arranged face to face. If the wafers A and B are made of different materials, "a shift" occurs due to a difference in the thermal expansion coefficient when they are heated. According to this embodiment, however, only part of the wafers can be held and pressured, to permit the other parts other than the pressured parts to be easily expanded and contracted in the in-plane direction. Resultantly, "the shift" due to the difference in the thermal expansion coefficient can be tolerated in bonding.

To pressure only part of the wafers, as shown in FIG. 12B, only the contact area of one of the jigs J1 may be made smaller than the other. In this case also, the wafer B is held wholly by the jig J3 but pressed only partly by the load P from the jig J1 above the wafer A. As a result, the wafers A and B can be expanded and contracted in the in-plane direction, thus absorbing and relaxing "the shift" due to a difference in the thermal expansion coefficient.

The following will describe the specific example of this embodiment as the seventh example of the invention.

SEVENTH EXAMPLE

FIGS. 13A to 13D are schematic cross-sectional views specifically explaining how to perform this embodiment.

Figure 13A:
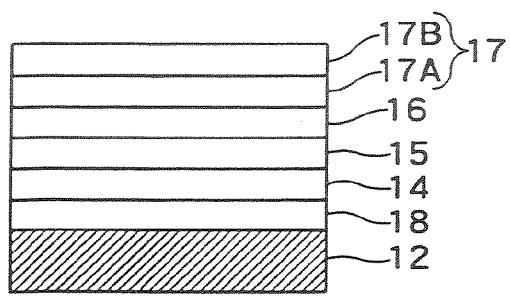
FIGS. 13A-13D are schematic cross-sectional views detailedly explaining a preparation process according to the seventh example of the present invention.
Figure 13B:
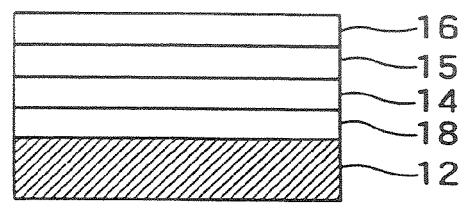

First, as shown in FIG. 13A, on an n-type GaAs substrate 12 of epitaxial wafers to be directly bonded to each other are sequentially formed in a laminate a buffer layer 18, an n-type cladding layer 14, an active layer 15, a p-type cladding layer 16, and a top-side cover layer 17. These epitaxial-grown layers are formed by e.g. a MOCVD (Metal Organic Chemical Vapor Deposition) method.

The n-type GaAs substrate 12, with a diameter of two inches and a thickness of 250 μm, has an impurity of Si doped to a carrier concentration of about $1\times10^{18}$ cm/cm$^3$ and also has its main face mirror-polished. The buffer layer 18 is made of GaAs, having a thickness of 0.5 μm The top layer, the top-side cover layer 17 is two-layer structured, with the lower layer being a 0.1-μm thick GaAs layer 17A and the upper layer being a 0.2-μm thick InGaAlP layer 17B.

Next, the epitaxial wafer was immersed in a mixture of ammonia and a hydrogen peroxide solution to remove a deposit on its back side and washed with an interfacial active agent, to subsequently etched etch the cover layer 17B made of InGaAlP using a phosphoric acid at 70° C. This etching process was selectively stopped at the underlying GaAs layer 17A. Next, the epitaxial wafer was immersed in a mixture solution consisting by volume of one part of ammonia and 15 parts of hydrogen peroxide solution to be etched, thus removing the underlying GaAs cover layer 17A as sown in FIG. 13B. This mixture solution was used to selectively etch the GaAs cover layer 17A, exhibiting actually that the top-side cover layer 17A was removed in a few seconds, to completely expose the p-type cladding layer 16 in one minute of immersion.

Figure 13C:
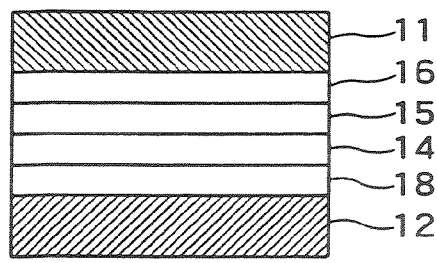
Figure 13D:
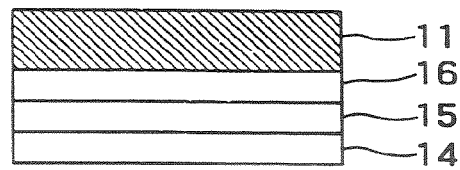

Next, direction bonding was conducted between the epitaxial wafer with the top-side cover layer 17 thus removed and the GaP substrate 11 on which was grown a high-concentration GaP layer with a carrier concentration of $2\times10^{18}$ cm$^{-3}$, to obtain an bonded wafer as shown in FIG. 13C. The process of this direct bonding is detailed as follows.

As a pretreatment for the direct bonding, the GaP substrate 11 was washed with an interfacial active agent and immersed in a dilute hydrofluoric acid to remove its natural oxide film, washed with water, and then dried with a spinner. Also, the epitaxial wafer had its top-side cover layer 17 removed by the above-mentioned method and then was subjected to a dilute hydrofluoric acid to remove the oxide film, washed with water, and then dried with a spinner like the GaP substrate 11. These pretreatment steps were all conducted in a clean atmosphere in a clean room.

Note here that as mentioned with the third embodiment, in this embodiment also, the epitaxial wafer ad the GaP substrate 11 may of course be adjusted in their crystal orientation so that their top and back sides may be bonded properly.

Next, the epitaxial wafer as finished of the pretreatment was placed with its epitaxial-grown layer facing upward, on which was placed the GaP substrate 11 with its mirror face facing downward, so that they were bonded tightly at room temperature. GaP is transparent, so that the tightly bonded state can be observed by visual inspection. Since the epitaxial wafer, when the GaP substrate 11 was placed thereon, was warped in a convex as viewed from the front, the GaP substrate 11 was bonded tight first at its middle. Only left as is, the tightly bonded portion of the GaP substrate 11 naturally spread to its periphery and, in one minute, that substrate was whole bonded tightly except chamfers at its periphery. This step was repeated to bond a total of 15 couples of the wafers at room temperature.

As the final step of the direct bonding, the wafer couple thus bonded at room temperature was placed in a diffusion furnace and subjected to a heat treatment for 800° C. The atmosphere employed was of argon containing 10% of hydrogen.

The bonded couples were classified into three groups each consisting of five couples and compared simultaneously using different heat treatment jigs.

As an example of the present invention, as exemplified in FIG. 12A, the substrates tightly bonded to each other were sandwiched vertically by carbon plates having each a 5-μm-diameter circular protrusion at the center thereof, on which was placed a 120-gram carbon-made weight to press only the middle thereof. These five jigs were all capable of bonding the whole surface of the wafers, thus avoiding wafer cracks.

As a comparison example, as exemplified in FIG. 12C, the wafers couple was placed on a flat carbon plate and, with no load placed thereon, subjected to the heat treatment. This method came up with a large peel-off portion in excess of 30% in area over two of the five couples. No wafer cracks were observed.

As another comparison example, as exemplified in FIG. 12D, the wafer couple was sandwiched between flat carbon plates and, with a weight placed thereon, subjected to the heat treatment. As a result, two of the five couples exhibited cracks and the remaining three came short of complete bonding. All the wafers including those with cracks had their periphery bonded but their middle peeled off, which may be considered because the periphery which was thicker due to irregularities in the wafer thickness was bonded first, so that a shift at the interface caused by thermal expansion could not be absorbed.

As described above, this embodiment came up with a confirmation that by partially holding and pressuring the wafers, the bonding process can be conducted at a high yield.

Sixth Embodiment

The following will describe a sixth embodiment with a semiconductor light emitting element having translucency to a light emitted from a light emitting layer. That is to say, the semiconductor light emitting element related to this embodiment can typically be formed using the substrate bonding technologies mentioned above with reference to the first through fourth embodiments.

Figure 14A:
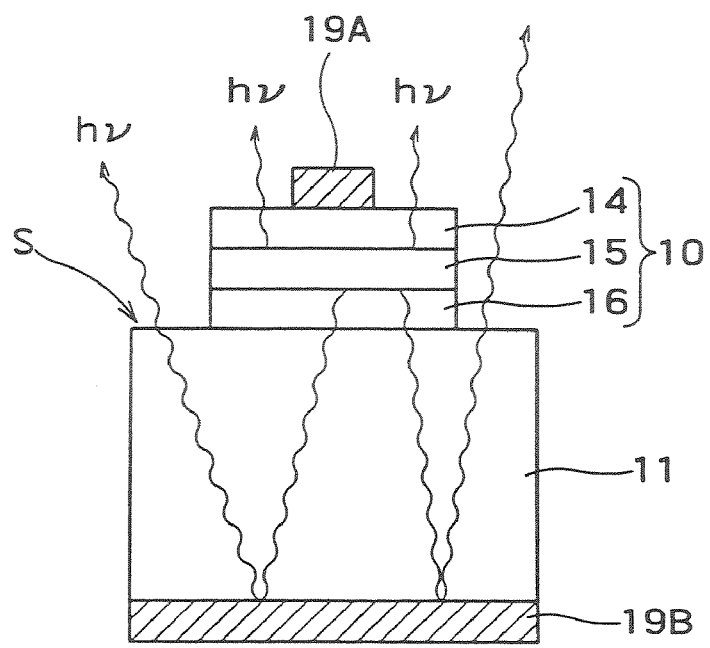
FIG. 14A is a schematic view showing a cross-sectional configuration of an LED regarding the fifth embodiment of the present invention.

First, such an example of the semiconductor light emitting element related to this embodiment is explained below that the brightness of an emitted light was improved by making the area of the light emitting layer contributing to light emission smaller than that of the transparent substrate. FIG. 14A is a concept diagram showing a cross-sectional configuration of the LED related to the embodiment, while FIG. 14B is a concept diagram showing that of a conventional LED given as a comparison example.

That is to say, both of the LEDs each comprise a GaP substrate 11, which has thereon a cladding layer 14, an active layer 15, and a cladding layer 16 and also which is sandwiched by an upper electrode 19A and a lower electrode 19B. However, besides those shown in FIG. 14, which is just a concept diagram, actually various components may be added such as a contact layer, a current-bottleneck layer, or a current-spread layer.

Figure 14B:
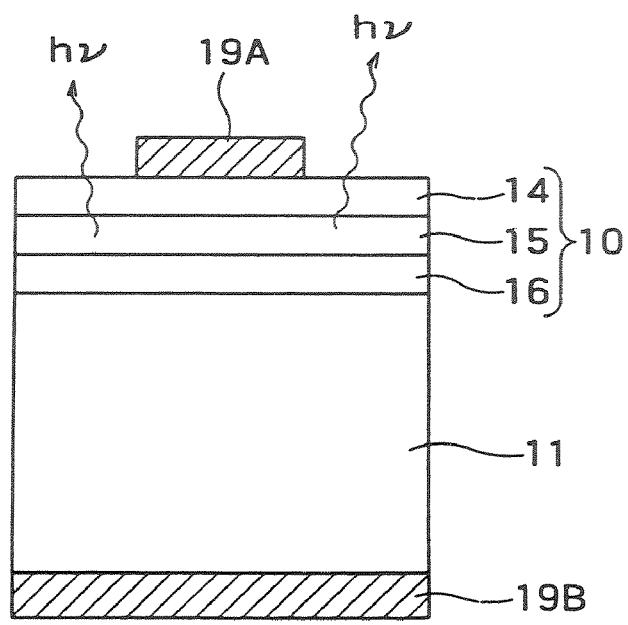
FIG. 14B is a schematic view showing that of a conventional LED as a comparison example.

As shown in FIG. 14B, the conventional LED has the active layer 15 and the transparent substrate equal to each other in size and also equal in area as viewed from the above. Such a conventional LED can be prepared by cutting or cleaving a wafer having many LEDs thereon into many dice of the LED chip.

As against this, in this embodiment, the laminate 10 including the active layer 15 has a smaller area than the transparent substrate 11. The active layer 15 is thus made smaller, to improve the light emitting efficiency of the LED. The following will describe a mechanism of improving the LED brightness by thus making the active layer area smaller.

In an LED, in general, when an electric current flows therein, carries thus injected are recombined to emit a light. In the case of an LED shown in FIGS. 10A and 10B, injected carriers are enclosed in the active layer sandwiched by the cladding layers 14 and 16 and recombined there. The carrier recombination, however, may come not only in such recombination as involving light emission but also in non-light emitting recombination not involving light emission. For example, there may occur non-light emitting recombination when carriers are recombined via a crystal defect level or an interface level.

Since the non-light emitting recombination is faster in reaction than light emitting recombination, injected carriers tend to be recombined dominantly in a non-light emitting manner. The defect level or the interface level, on the other hand, is limited in terms of its density in crystal, so that when the non-light emitting recombination is saturated with a certain constant current, a current component in excess of that constant current is dissipated in light emitting recombination, thus emitting a light. Therefore, when a same amount of current flows through an LED, a smaller area through which the current flows would more reduce a current component dissipated in non-light emitting recombination, thus improving the ratio of the light emitting recombination as against the injected current, i.e. the LED brightness.

A smaller area of the light emitting layer, however, suffers a problem of deteriorated light take-out efficiency because the light emitted is blocked by the electrode 19A. Therefore this, a transparent substrate is advantageous.

That is to say, since the light emitting layer of LEDs is thin as compared to the substrate, a light emitted toward the substrate from the light emitting layer in such an LED that has the opaque substrate is absorbed in the substrate and cannot be taken out of it. In short, LEDs using an opaque substrate is capable only of taking out the light emitted upward from the light emitting layer. If such an LED that has an opaque substrate has a smaller light emitting layer, an increase in the light emitting efficiency is dominated by a decrease in the take-out efficiency due to the blocking of light by the upper-side electrode 19A, thus deteriorating the LED brightness.

For the same reason, even with such an LED that has a transparent substrate, it is not preferable to make small not only the area of the light emitting layer but also that of the substrate. In the transparent-substrate LED, as shown in FIG. 14A, a light emitted from the light emitting layer to the substrate passes through the substrate 11 and is reflected at the lower-side electrode 19B. If an upper face S of the transparent substrate 11 is exposed on both sides of a laminate 10 given as a light emitting layer, the light reflected at the lower-side electrode 19B can be taken out of this exposed portion S. With this, even when the laminate 10 as the light emitting layer is made small, the take-out efficiency does not decrease unless the substrate 11 is made small in area.

Figure 15:
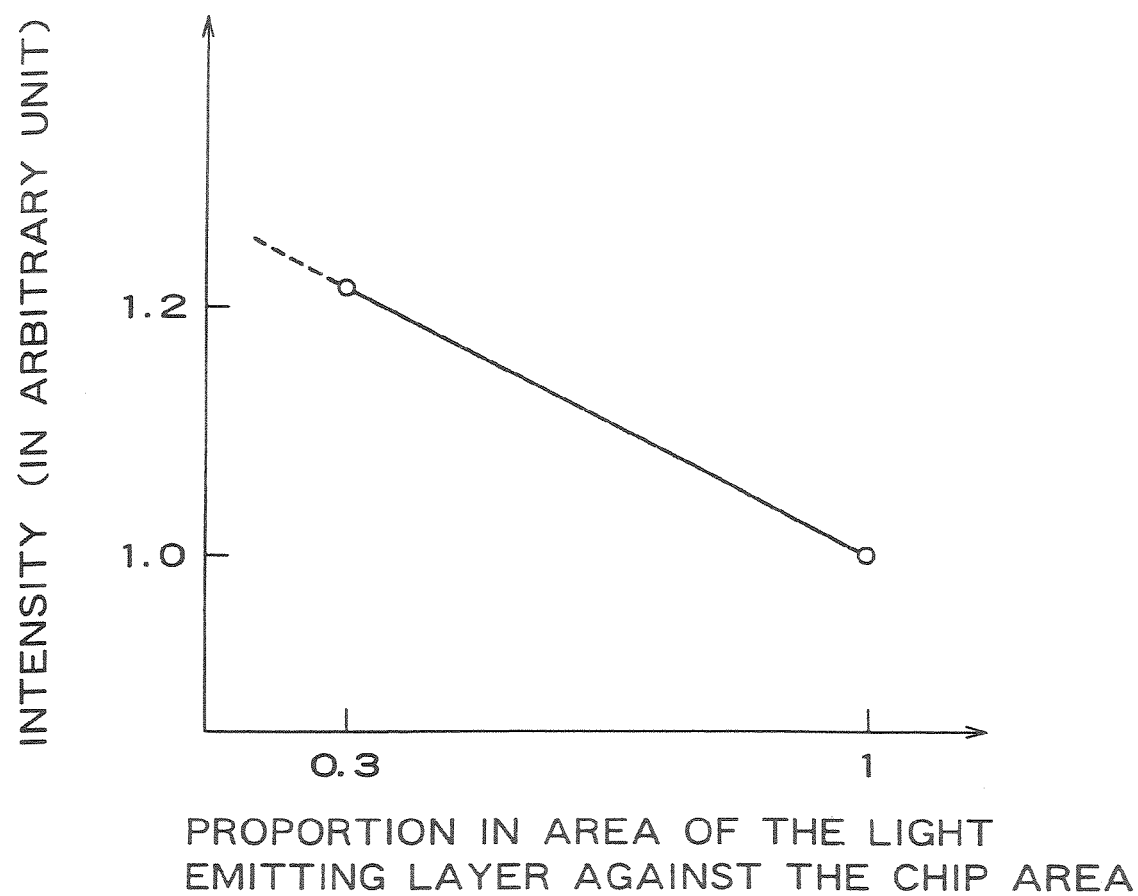
FIG. 15 is a graph showing a relationship between a ratio of an area of a light emitting layer to a chip area and an intensity of an externally emitted light in an InGaAlP-based LED having a transparent substrate exemplified in FIG. 14.

FIG. 15 is a graph showing a relationship between the proportion in area of the light emitting layer against the chip area and the intensity of an externally emitted light for such an InGaAlP-based LED having a transparent substrate as exemplified in FIG. 14. That is to say, this drawing gives the data of the InGaAlP-based LED formed by GaP substrates with a chip size of 300 μm×300 μm and an upper-side electrode diameter of 120 μm.

As shown in this drawing, with the decreasing area of the light emitting layer, the intensity of the light emitted increases, so that at a ratio of the area of 0.3, the light emitting intensity becomes about 1.2 times that at a ratio of 1.0. Thus, by forming the light emitting layer in area smaller than the substrate of an LED employing a transparent substrate, the light emitting efficiency can be improved while suppressing a decrease in the light take-out efficiency.

The following will describe specific examples of a preparation process of a light emitting element according to this embodiment.

FIGS. 16A-17C are flow diagrams showing important steps in the preparation process of the semiconductor light emitting element according to this embodiment.

Figure 16A:
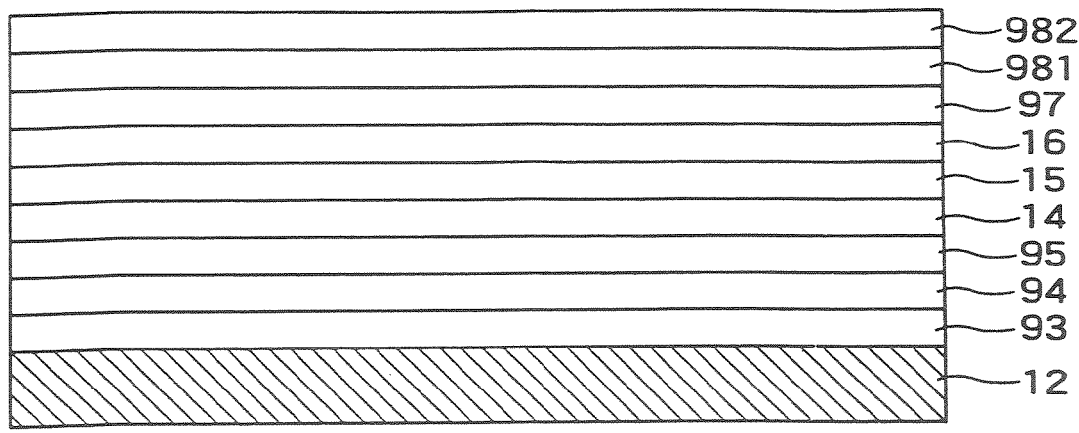
FIGS. 16A-17C are cross-sectional procedure views showing important steps in a preparation process of a semiconductor light emitting element in the sixth embodiment according to the present invention.

Epitaxial wafers to be directly bonded to each other had such a configuration as shown in FIG. 16A, i.e. on the GaAs substrate 12 were epitaxial layers 93 through 982 by the MOCVD method. In this case, the n-type GaAs substrate 12 has a diameter of two inches, a thickness of 250 μm, and a carrier concentration of about $1\times10^{18}/cm^3$ by means of Si doping and is mirror-finished. An etching stop layer 93 is made of InAlP and has a thickness of 0.2 μm. A GaAs contact layer 94 has a thickness of 0.02 μm and a carrier concentration of $1\times10^{18}/cm^3$. An InGaAlP current-spread layer 95 is made of InGaAlP with an Al composition ratio of 0.3 and has a thickness of 1.5 μm, while the n-type cladding layer 14 is made of InGaAlP with an Al composition ratio of 0.6 and has a thickness of 0.6 μm. An active layer 15 is made of InGaAlP with an Al composition of 0.13 and has a thickness of 0.4 μm. A p-type cladding layer 16 is made of InGaAlP with an Al composition ratio of 0.6 and has a thickness of 0.6 μm. An InGaP bonding layer 97 has a thickness of 0.1 μm, a GaAs cover layer 981 has a thickness of 0.1 μm, and an InAlP cover layer 982 has a thickness of 0.15 μm.

Next, this epitaxial wafer was washed with an interfacial active agent and immersed in a mixture solution consisting in volume of one part of ammonia and 15 parts of hydrogen peroxide solution to etch the lower side of the GaAs substrate 12 in order to remove the epitaxial reaction product attached on the back side of the epitaxial wafer. In this case, the top side of the epitaxial wafer (upper side in this drawing) was not etched because it was covered with the InAlP cover layer 98.

Next, the epitaxial wafer was washed again with an interfacial active agent and then with a phosphoric acid to remove the InAlP cover layer 982 on the top side. Subsequently, the GaAs cover layer 981 was removed using a mixture solution consisting in volume of eight parts of a sulfuric acid, one part of a hydrogen peroxide solution, and one part of water. This mixture solution was used to selectively etch the GaAs cover layer, so that after etching, the InGaP bonding layer was exposed on the top side of the epitaxial wafer.

Figure 16B:
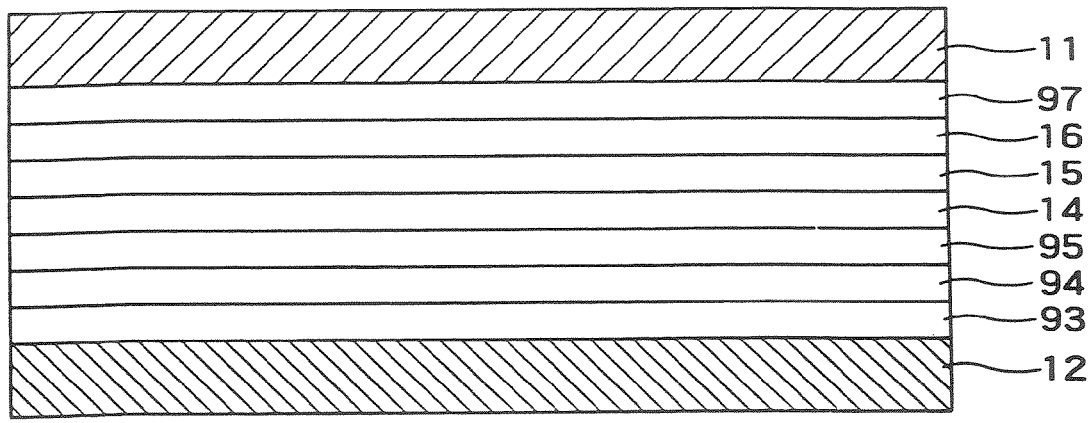

Subsequently, the epitaxial wafer with its top-side cover layer removed was directly bonded to the GaP wafer 11, to obtain an bonded couple shown in FIG. 16B. The process of this direct bonding is detailed as follows.

As the GaP wafer, such a p-type mirror-finished wafer was used that has a diameter of two inches and a thickness of 250 μm. To reduce the electric resistance at the interface, a high-concentration layer may sometimes be epitaxial-grown on the surface of the GaP wafer.

Here, as mentioned above with reference to the third embodiment, it is desirable to adjust the crystal orientation of both the epitaxial layer and the GaP layer so that their respective "top side" and "back side" may face to each other in bonding.

In the pretreatment of the direct bonding, the GaP wafer was washed with an interfacial active agent and immersed in a dilute hydrofluoric acid to remove a natural oxide film on the surface, washed with water, and then dried with a spinner. Also, the epitaxial wafer, after its to-side cover layer was removed, was subjected to dilute hydrofluoric acid processing to remove the oxide film, washed with water, and then dried with a spinner. These pretreatment steps were all conducted in a clean atmosphere in the clean room.

Next, the wafer as finished of the pretreatment was placed with its top side facing upward, on which was placed the GaP wafer 11 with its mirror face facing downward, so that they were bonded to each other at room temperature. The GaP wafer 11 is transparent, so that the bonding state can be observed by visual inspection. Since the epitaxial wafer was warped in convex when they were superposed one on top of the other, the wafers were tightly bonded first from their middle. Only left as is, the tightly bonded portion naturally spread, thus permitting the whole surface except the chamfered portions at the wafer periphery to be bonded tightly.

In this step also, as mentioned above with the fourth embodiment, by pressurizing only part of the wafer, it can be bonded securely while inhibiting cracking.

In the final step of the direct bonding, the wafers tightly bonded at room temperature were arranged vertically on a quartz-made board and then placed in a diffusion furnace for the heat treatment. The heat treatment was conducted at 800° C. in an argon atmosphere containing 10% of hydrogen for one hour.

Figure 16C:
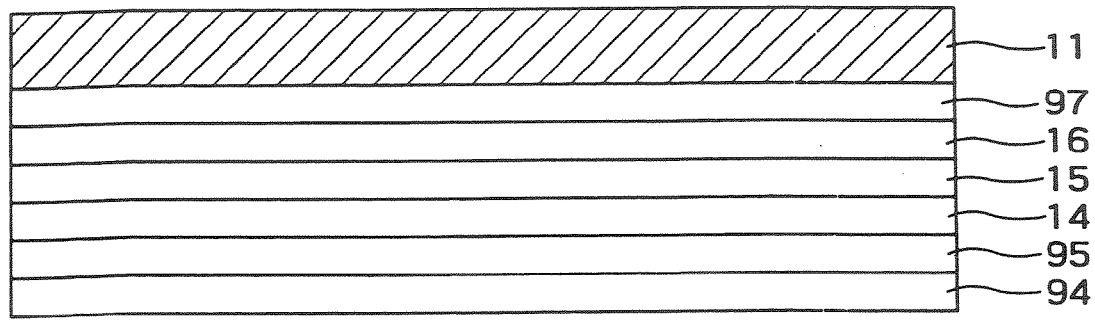

Next, the GaAs substrate 12 was removed of the epitaxial wafer. First, the bonding couple was immersed in a mixture solution consisting of ammonia and a hydrogen peroxide solution to selectively etch GaAs. This etching stopped at the InAlP etching stop layer. Then, it was etched with a phosphoric acid at 70° C. to selectively remove the InAlP etching stop layer 93, thereby obtaining such a laminate as shown in FIG. 16C.

Figure 17A:
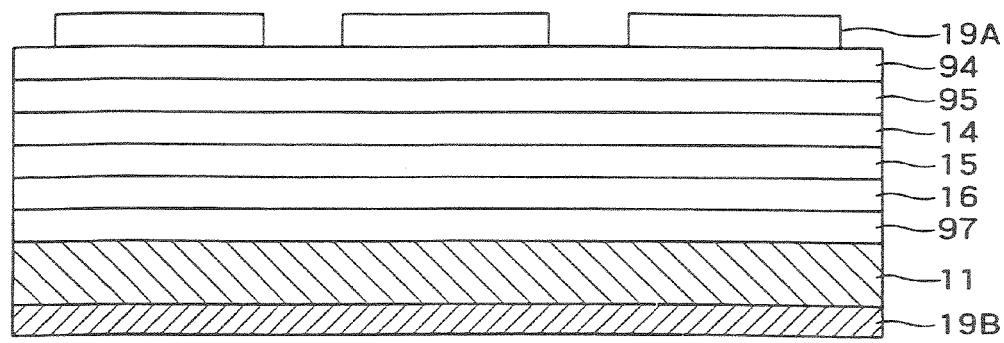

Next, on the back side of the GaP substrate 11 of this laminate was provided a electrode 19B made of a gold (Au)/Zn alloy and gold (Au), while on the top side (upper side in the drawing) of a GaAs contact layer 94 was provided an electrode 19A made of a gold (Au)/Ge alloy and gold (Au). Then, by the PEP (photo-engraving process), the upper-side electrode 19A was processed at a 300-μm pitch into a circle with a diameter of 200 μm, thus obtaining such a structure as shown in FIG. 17A.

Figure 17B:
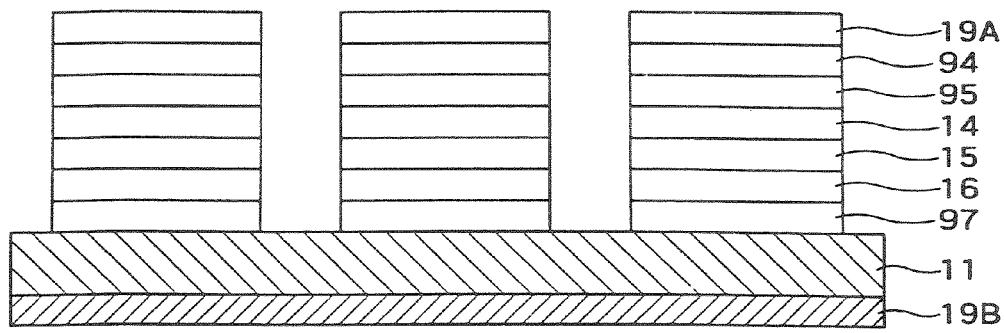

Next, to make the light emitting layer smaller in area than the transparent substrate, that structure was etched using the gold electrode 19A as a mask, to specifically etch epitaxial layers 94 through 97 as shown in FIG. 17B. In this case, the GaAs epitaxial layer 94 was etched with a mixture solution consisting of ammonia and a hydrogen peroxide solution, while the InGaAlP-based epitaxial layers 94 through 16 and the InGaP-based epitaxial layer 97 were etched with a IIBr—Br solution.

Figure 17C:
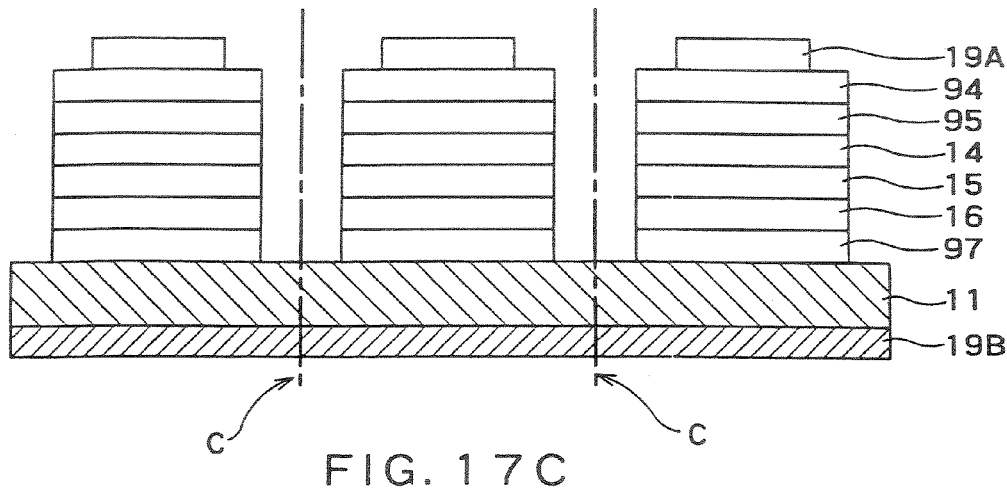

Finally, as shown in FIG. 17C, the electrode 19A was patterned again into a circle with a diameter of 120 μm, to cleave the wafer at a dash-and-dot line C into sections of 300-μm□, thereby obtaining an LED chip having such a configuration as shown in FIG. 14A.

Note here in FIG. 14A, part of the epitaxial layer of FIG. 17C is omitted.

The following will describe a preparation process for making the light emitting layer smaller in area prior to wafer bonding, as another example of this embodiment.

FIG. 18 is a process cross-sectional view showing important steps of performing the this embodiment.

Figure 18A:
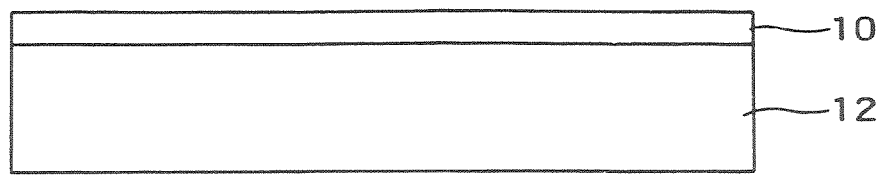
FIGS. 18A-18E are cross-sectional procedure views showing important steps in a preparation process for reducing an area of the light emitting layer prior to bonding wafers.
Figure 18B:
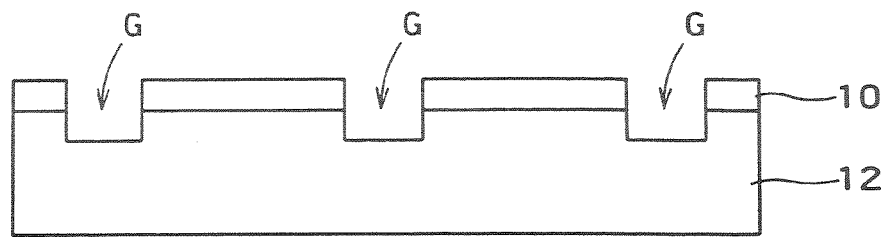

First, as shown in FIG. 18A, such an epitaxial wafer was formed that has the laminate 10 formed as the light emitting layer on the GaAs substrate 12. This epitaxial wafer was subjected to blade dicing both horizontally and vertically at e.g. a 300-μm pitch, thereby providing a trench G with a width of 100 μm and a depth of 20 μm.

Figure 18C:
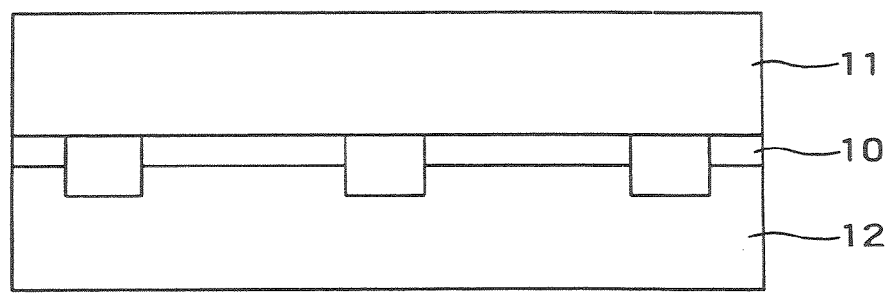

Next, as shown in FIG. 18C, the GaAs substrate 11 was bonded.

Figure 18D:
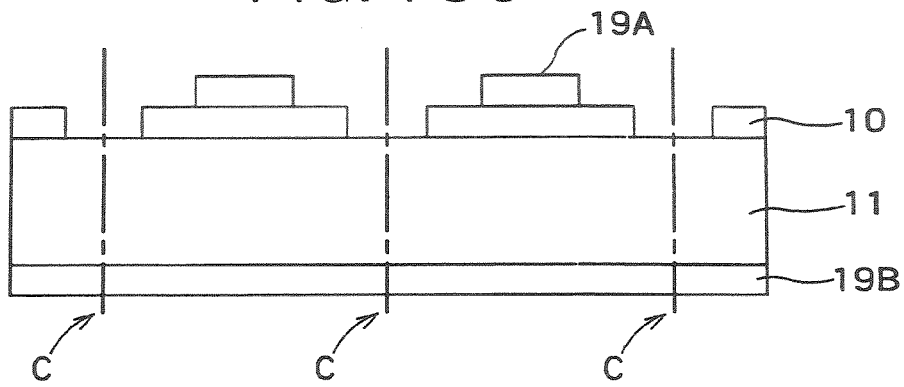

Next, as shown in FIG. 18D, the GaAs substrate 12 was removed, so that the bonded couple was turned upside down, to thus form thereon the electrodes 19A and 19B.

Figure 18E:
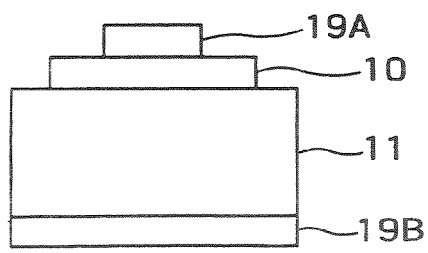

Finally, it was cleaved and diced and separated along the dash-and-dot line C into devices, thus obtaining such an LED as shown in FIG. 18E.

When the epitaxial wafer formed on the GaAs substrate 12 is bonded to the GaP substrate 11, a stress occurs due to a difference of the thermal expansion coefficient of GaA and that of GaP, thus leading to a warp after bonding or, in a worst case, destruction of the wafer.

To guard against this, in this example, as shown in FIG. 18C, the trench G was formed on the epitaxial top side when the wafers were bonded to each other and the bonding portion was divided into small-area sections, so that the stress can be relaxed, thus advantageously reducing the warp and the destruction.

Also, when the wafers are bonded to each other, air may be captured between these two wafers, thus creating non-bonded portion. The trench G such as given in this example permits the captured air to escape out of the wafers, thus advantageously reducing the possibility of non-bonded portion being created.

Note here that although, in the above-mentioned example, the epitaxial wafer has been divided by blade dicing before being bonded, the trench G may be formed by patterning the wafer by the PEP.

The following will describe variant examples of the semiconductor light emitting element according to this embodiment.

Figure 19:
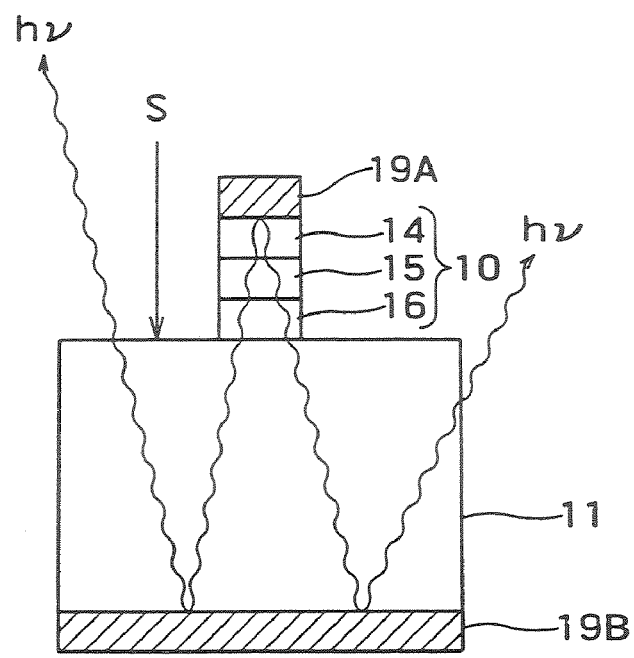
FIG. 19 is a schematic view showing a semiconductor light emitting element in which a laminate 10 as a light emitting layer is reduced to much the same area as an upper-side electrode 19A.

FIG. 19 is a schematic diagram showing a variant example of the semiconductor device according to thus embodiment. That is to say, in this variant example, the laminate 10 as the light emitting layer was reduced in area to almost the same as the upper-side electrode 19A.

In this structure, the top side of the laminate 10 as the light emitting layer is wholly covered with the electrode 19A, so that a light emitted upward from the light emitting layer is reflected at the electrode 19A and enters the transparent substrate 11 to be taken out either from the side face of the substrate 11 or from the upper face S of the substrate 11 not covered by the electrode 19A.

The light emitting element according to this variant example differs from the example of FIG. 14A or the conventional example of FIG. 14B in a respect that little of the light taken out from the upper face of the LED passes through the light emitting layer 15. That is to say, in this variant example, the active layer 15 acts as a comparatively small light source, so that most of the light emitted from this light source passes through the substrate 11 and is reflected at the lower-side electrode 19B, to be taken out from the upper face S.

The wavelength of the light emitted from the LED depends on a band gap of the active layer 15. The cladding layers 14 and 16 are designed to have a larger band gap than the active layer in order to enclose the carriers, thus failing to absorb the light from the active layer 15. The active layer 15 itself, however, absorbs the light it emitted itself. Also, such a GaAs contact layer necessary for electrical connection that has a small band gap also absorbs an emitted light. Therefore, it is preferable because of less absorption to take out the light without passing it through the active layer or contact layer including such a layer that absorbs light. In this respect, this variant example shown in FIG. 18 is advantageous.

To obtain such a configuration as shown in FIG. 19, in a process shown in FIGS. 12 and 13 for example, the electrode 19A shown in FIG. 17A may be patterned first time with a size shown in FIG. 17C and then used as a mask to etch the light emitting layer.

Alternatively, the light emitting element of FIG. 19 can be made by a totally different method. FIG. 20 is a process cross-sectional view showing important steps in a preparation process of a semiconductor light emitting element shown in FIG. 19.

Figure 20A:
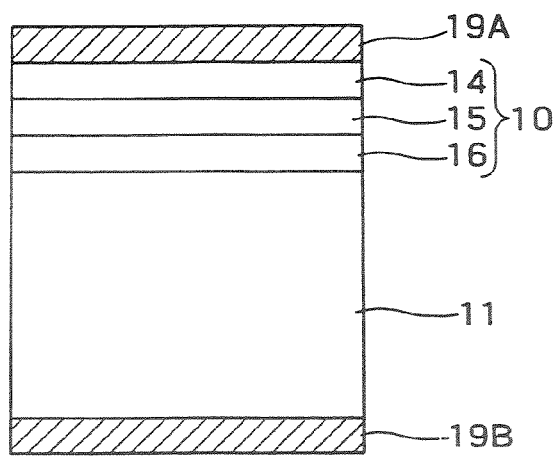
FIGS. 20A-20C are cross-sectional procedure views showing important steps in the preparation process of the semiconductor light emitting element in FIG. 19.

First, as shown in FIG. 20A, the wafers are divided, without being patterned, into chips with both the upper-side and lower-side electrodes 19A and 19B of the LED as attached on the whole surface.

Figure 20B:
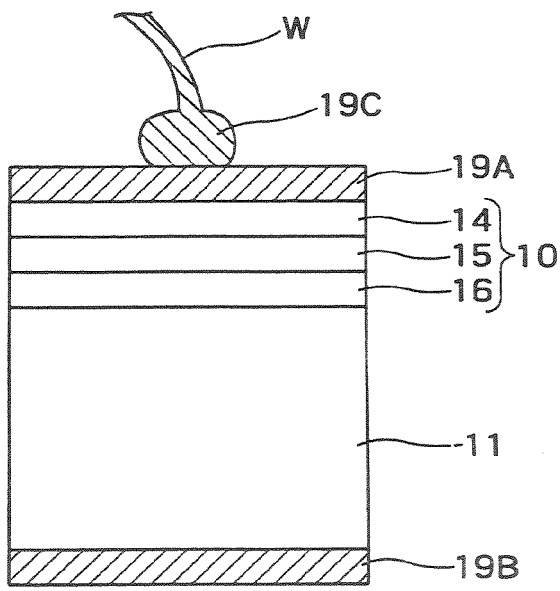

Next, thus obtained chip is subjected to wire bonding as shown in FIG. 20B. With this, above the electrode 19A, wire W is connected to a ball portion 19C formed in ball.

Figure 20C:
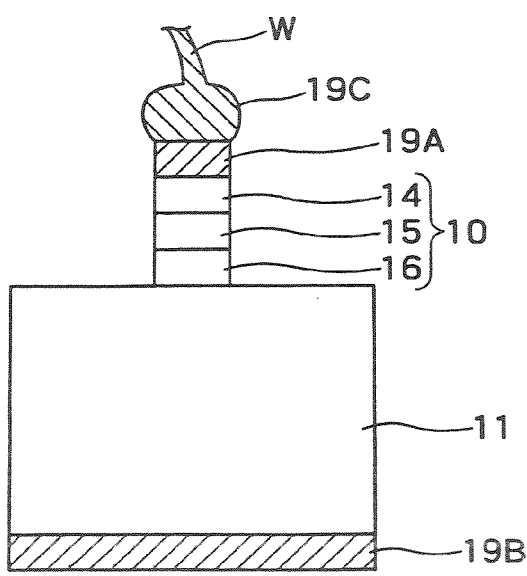
Figure 22:
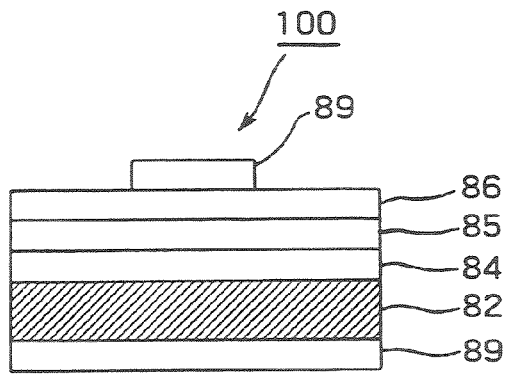
FIG. 22 is a schematic cross-sectional view showing one example of a conventional visible-light LED made of InGaAlP.
Figure 23A:
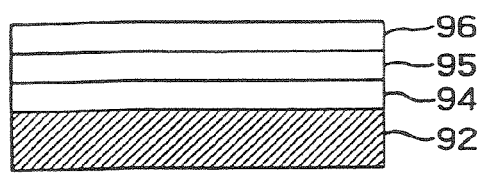
FIGS. 23A-23D are schematic cross-sectional views showing a conventional preparation process of the LED in FIG. 22.
Figure 23B:
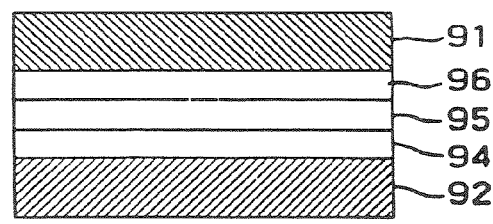
Figure 23C:
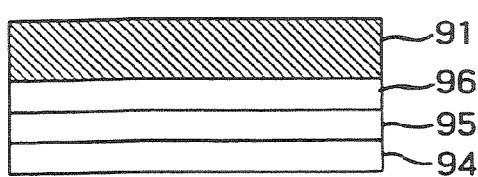
Figure 23D:
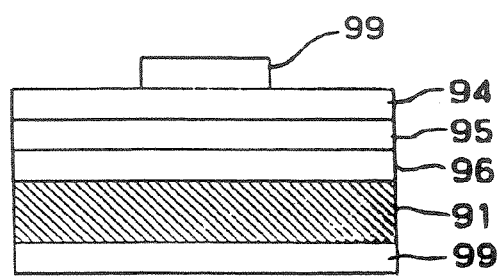

Next, using this ball portion 19C as a mask, the upper-side electrode 19A and the laminate 10 as the light emitting layer are etched, to obtain such a structure as shown in FIG. 20C.

By the above-mentioned method, the laminate 10 can be electrified via the wire W during etching, thus emitting a light. That is to say, it is also possible to permit the light emitting element to emit a light while monitoring its power during etching, thus stopping the etching immediately after an optimal light-emission intensity is obtained.

The following will describe a semiconductor light emitting element according to another example of this embodiment.

Figure 21:
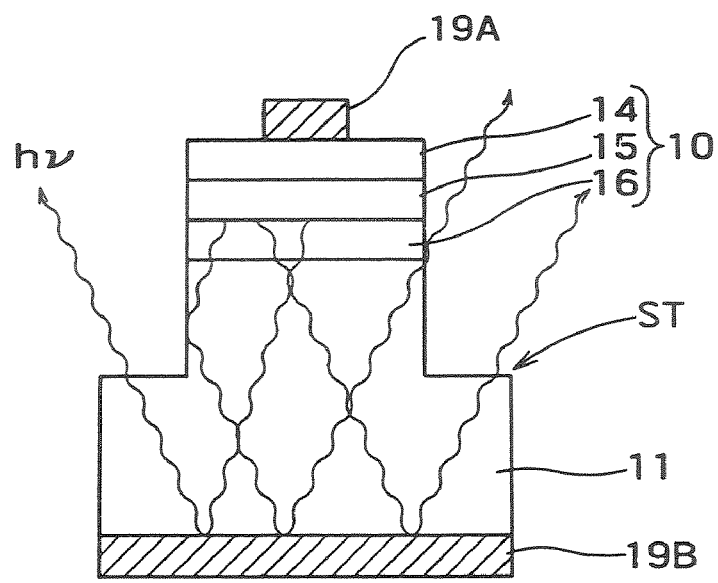
FIG. 21 is a schematic view showing a configuration of a semiconductor light emitting element in which a step ST is provided on the side of a transparent substrate 11.

FIG. 21 is a concept diagram showing a configuration of the semiconductor light emitting element according to this example. That is to say, the light emitting element of this example is provided with a step ST on a side face of its transparent substrate 11, the upper part of which is made small to match the size of the laminate 10 given as the light emitting layer.

This structure can be obtained by bonding the GaP wafer 11 to the GaAs substrate (not shown) and selectively etching it off and then, in such a state as shown in FIG. 16C or 16A, providing a trench by blade dicing or etching in the transparent substrate 11 from the light emitting layer side beyond the light emitting layer up to the upper part of that substrate 11.

In the light emitting element of this example, it may often occur that a light which has entered from the active layer 15 to the transparent substrate 11 is not only reflected directly only once but also reflected in a complex manner inside the transparent substrate 11, to be taken out. Generally, a more complex geometry of the light take-out portion has a higher light-take-out efficiency, so that according to this example, the transparent substrate 11 is provided with the step, thus further improving the light-take-out efficiency.

Although, in the example shown in FIG. 21, the transparent substrate 11 has its upper side smaller than the lower side by one step, it may should be made further smaller by two steps or more in order to obtain an even higher light-take-out efficiency.

In the above the first through sixth embodiments have been described with reference to the specific examples. The present invention, however, is not restricted to these specific examples.

For example, the materials of those semiconductor device are not limited to GaAs and Gap but may be any other various compound semiconductors applied to the present invention, to obtain almost the same effects as mentioned above.

Also, the laminate structure of the semiconductor light emitting element may be provided, in addition, with various components such as a contact layer and a current-spread layer, to have the same effects. Besides, for example, as the active layer, an MQW (multiple-quantum well) structure may be employed or as the cladding layer, an MQB (multiple-quantum barrier) may be employed in application.

Moreover, the present invention can be applied not only to LEDs but also to semiconductor lasers or other various semiconductor devices.

As detailed above, the present invention has the following effects.

That is to say, the present invention will eliminate obstructions against the direction bonding such as deterioration of the cleanness of epitaxial wafer surfaces, their warp, and a difference in thermal expansion between the epitaxial-grown layer and the substrate, thus providing a bonding type semiconductor substrate which is tightly bonded directly and wholly to the epitaxial wafer.

Also, the present invention permits an epitaxial-grown layer contributing to light emission by such a light emitting element as an LED to be directly and in a stable manner bonded to a substrate not absorbing thus emitted light, thus providing a high-brightness semiconductor light emitting element.

Further also, the present invention enables the production at a higher yield of both the bonding type semiconductor substrate and the semiconductor light emitting element which have the above-mentioned effects.

Further also, according to the present invention, by bonding "the top side" and "the back side" of wafers sliced off ingots taking into account the crystal anisotropy, it is possible to reduce dangling bonds and crystal defects at the interface, thus significantly lowering the interface resistance.

Further also, the present invention makes it possible to partially holding and pressurizing the two wafers when they are bonded to each other, thus performing the bonding process with a high yield.

Further also, according to the present invention, by making the light emitting layer smaller in area than the transparent substrate, the light-emission efficiency can be improved without lowering the LED's take-out efficiency, thus resulting in high-brightness LEDs being obtained.

Further also, according to the present invention, it is possible to apply wafer bonding technologies to prepare the above-mentioned LED efficiently. In particular, such a preparation process that divides an epitaxial wafer before bonding has an effect to disperse the thermal stress, thus preventing failures from occurring in the bonding process.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Applications No. H11-162985 filed on Jun. 9, 1999, No. H11-1741387 filed on Jun. 21, 1999 and No. 2000-89754 filed on Mar. 28, 2000 including specifications, claims, drawings and summaries are incorporated herein by references in their entirety.

What is claimed is:

1. A process for preparing a bonding type semiconductor substrate comprising:
   a first step of forming a first epitaxial growth layer by epitaxially growing semiconductor crystals on a first semiconductor substrate, and
   a second step of integrally joining, to said first epitaxial growth layer, a second semiconductor substrate whose at least one surface is mirror-polished, by placing the substrate on the first epitaxial growth layer so that the substrate may come into contact with the first epitaxial growth layer via the mirror-polished surface or a second epitaxial growth layer grown on the mirror-polished surface.

2. The process for preparing the semiconductor light emitting element according to claim 1, wherein a groove is formed on the surface to be joined of at least one of said first semiconductor substrate and said second semiconductor substrate prior to the joining.

3. The process for preparing a bonding type semiconductor substrate according to claim 1, wherein contaminants and dust particles are removed from the surface of said first epitaxial growth layer between the first step and the second step.

4. A process for preparing a bonding type semiconductor substrate comprising:
   a first step of forming an epitaxial growth layer by epitaxially growing semiconductor crystals on a first semiconductor substrate by selecting a composition ratio so as to match a lattice constant of the first semiconductor substrate, and
   a second step of integrally joining a second semiconductor substrate whose at least one surface is mirror-polished, to said epitaxial growth layer by placing the substrate on the epitaxial growth layer so that the substrate may come into contact with the epitaxial growth layer via the mirror-polished surface.

5. The process for preparing a bonding type semiconductor substrate according to claim 4 further comprising a third step of subjecting the resultant laminate to a heat treatment after at least part of the surface of said first semiconductor substrate has been removed therefrom.

6. The process for preparing the bonding type semiconductor substrate according to claim 4, wherein said first step comprises a step of forming a cover layer on said epitaxial growth layer and
   said second step is a step of removing said cover layer by etching.

7. The process for preparing the bonding type semiconductor substrate according to claim 4, wherein said second step is a step of removing a surface part of said epitaxial growth layer.

8. The process for preparing a bonding type semiconductor substrate according to claim 4, wherein contaminants and dust particles are removed from the surface of said epitaxial growth layer between the first step and the second step.

9. A process for preparing a semiconductor light emitting element comprising:
   a step of forming an epitaxial growth layer comprising a laminate where a first cladding layer, an active layer, and a second cladding layer are deposited in turn on a first semiconductor substrate by epitaxially growing mixed crystals of a compound semiconductor,
   a step of forming a cover layer on said second cladding layer,
   a step of exposing the surface of said second cladding layer by removing said cover layer,
   a step of integrally bonding a second semiconductor substrate having a mirror-finished main surface to said second cladding layer having the exposed surface by placing the substrate on said second cladding layer so that said main surface of the substrate may come into contact with said second cladding layer,
   a step of carrying out a heat treatment after at least a surface part of said first semiconductor substrate has been removed by etching,
   a step of exposing said first cladding layer by etching, and
   a step of forming electrodes on the front side of said first cladding layer and on the back side of said second semiconductor substrate.

10. The process for preparing the semiconductor light emitting element according to claim 9, wherein said epitaxial growth layer is formed between said first semiconductor substrate and said laminate and contains a protective film that functions as an etching stopper in the step of removing said first semiconductor substrate.

11. A process for preparing a semiconductor light emitting element comprising:
    making a light emitting body including a light emitting layer; and
    integrally bonding a first and a second semiconductor substrates and said light emitting body by a heat treatment at a high temperature after sandwiching said light emitting body by said first and second semiconductor substrates, wherein said integrally bonding step is conducted so that the bonding of said light emitting body and said first semiconductor substrate and the bonding of said light emitting body and said second semiconductor substrate are performed at once by said heat treatment.

12. A process for preparing a semiconductor light emitting element comprising the steps of:
    epitaxially growing a light emitting body including a light emitting layer on a growth substrate;
    placing a first semiconductor substrate on an upper surface of said light emitting body in a close contact at a first temperature;
    removing said growth substrate so that the lower surface of said light emitting body is exposed;
    placing a second semiconductor substrate on said lower surface of said light emitting body in a close contact at a second temperature; and
    integrally bonding said light emitting body and said first and second semiconductor substrates by annealing at a third temperature higher than said first and second temperatures.

13. The process for preparing a semiconductor light emitting element according to claim 12, wherein said third temperature is higher than 500° C. and lower than 1200° C.

* * * * *